(12) United States Patent
Lee

(10) Patent No.: US 11,658,233 B2
(45) Date of Patent: May 23, 2023

(54) SEMICONDUCTORS WITH IMPROVED THERMAL BUDGET AND PROCESS OF MAKING SEMICONDUCTORS WITH IMPROVED THERMAL BUDGET

(71) Applicant: Cree, Inc., Durham, NC (US)

(72) Inventor: Kyoung-Keun Lee, Cary, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 16/688,344

(22) Filed: Nov. 19, 2019

(65) Prior Publication Data

US 2021/0151592 A1 May 20, 2021

(51) Int. Cl.
| | |
|---|---|
| *H01L 29/778* | (2006.01) |
| *H01L 29/205* | (2006.01) |
| *H01L 29/40* | (2006.01) |
| *H01L 29/47* | (2006.01) |
| *H01L 29/423* | (2006.01) |
| *H01L 21/02* | (2006.01) |
| *H01L 21/285* | (2006.01) |
| *H01L 21/311* | (2006.01) |
| *H01L 21/765* | (2006.01) |

(Continued)

(52) U.S. Cl.
CPC ...... *H01L 29/7786* (2013.01); *H01L 21/0217* (2013.01); *H01L 21/28581* (2013.01); *H01L 21/28587* (2013.01); *H01L 21/31111* (2013.01); *H01L 21/765* (2013.01); *H01L 29/2003* (2013.01); *H01L 29/205* (2013.01); *H01L 29/402* (2013.01); *H01L 29/408* (2013.01); *H01L 29/42316* (2013.01); *H01L 29/475* (2013.01); *H01L 29/66462* (2013.01); *H03F 3/21* (2013.01); *H03F 2200/451* (2013.01)

(58) Field of Classification Search
CPC . H01L 29/7786; H01L 29/408; H01L 29/475; H01L 29/205; H01L 29/42316; H01L 21/31111; H01L 29/2003; H01L 21/765; H01L 21/0217; H01L 21/28581; H01L 29/66462; H01L 29/402; H01L 21/28587; H03F 3/21; H03F 2200/451
See application file for complete search history.

(56) References Cited

U.S. PATENT DOCUMENTS

| | | |
|---|---|---|
| 7,045,404 B2 | 5/2006 | Sheppard et al. |
| 7,901,994 B2 | 3/2011 | Saxler et al. |

(Continued)

FOREIGN PATENT DOCUMENTS

WO 2012111363 A1 8/2012

OTHER PUBLICATIONS

International Search Report and Written Opinion issued in PCT/US20/60847, dated Feb. 11, 2021.

*Primary Examiner* — Mohammed R Alam
(74) *Attorney, Agent, or Firm* — BakerHostetler

(57) ABSTRACT

A device including a substrate, a passivation layer, a source, a gate, a drain, and the gate including at least one step portion. Where the at least one step portion is arranged within the passivation layer, the at least one step portion includes at least one first surface and at least one second surface, where the at least one first surface is connected to the at least one second surface, where the gate includes a third surface, and where the at least one step portion is connected to the third surface. A process is also disclosed.

25 Claims, 13 Drawing Sheets

(51) Int. Cl.
*H01L 29/66* (2006.01)
*H01L 29/20* (2006.01)
*H03F 3/21* (2006.01)

(56) References Cited

U.S. PATENT DOCUMENTS

| | | |
|---|---|---|
| 2007/0018199 A1 | 1/2007 | Sheppard et al. |
| 2007/0164322 A1* | 7/2007 | Smith ............... H01L 29/66462 257/256 |
| 2007/0224710 A1* | 9/2007 | Palacios .............. H01L 29/7786 438/12 |
| 2011/0212582 A1 | 9/2011 | Hong et al. |
| 2011/0272743 A1 | 11/2011 | Hwang et al. |
| 2012/0043591 A1 | 2/2012 | Takada |
| 2013/0161698 A1 | 6/2013 | Marino et al. |
| 2014/0001478 A1 | 1/2014 | Saunier et al. |
| 2014/0084343 A1 | 3/2014 | Dewey et al. |
| 2014/0231823 A1* | 8/2014 | Chowdhury .......... H01L 29/045 438/669 |
| 2015/0311084 A1 | 10/2015 | Moore et al. |
| 2016/0005823 A1 | 1/2016 | Yao et al. |
| 2016/0293746 A1 | 10/2016 | Murase |
| 2017/0125571 A1 | 5/2017 | Huang et al. |
| 2017/0170089 A1 | 6/2017 | Donkers et al. |
| 2017/0263742 A1 | 9/2017 | Endoh |
| 2017/0365701 A1 | 12/2017 | Kim et al. |
| 2018/0358456 A1 | 12/2018 | Iucolano et al. |
| 2019/0267467 A1 | 8/2019 | Yoshimochi |
| 2020/0219987 A1 | 7/2020 | Lee et al. |

\* cited by examiner

SEMICONDUCTORS WITH IMPROVED THERMAL BUDGET AND PROCESS OF MAKING SEMICONDUCTORS WITH IMPROVED THERMAL BUDGET

FIELD OF THE DISCLOSURE

The disclosure relates to semiconductors with improved thermal budget. The disclosure further relates to a process of making semiconductors with improved thermal budget.

BACKGROUND OF THE DISCLOSURE

Semiconductor devices such as Group III-nitride based high-electron mobility transistors (HEMTs) are very promising candidates for high power amplifiers, radiofrequency (RF) applications, and also for low frequency high power switching applications since the material properties of Group III-nitrides, such as gallium nitride (GaN) and its alloys enable achievement of high voltage and high current along with high RF gain and linearity for RF applications. A typical Group III-nitride HEMT comprises a substrate, a Group III-nitride (e.g., GaN) buffer or channel layer formed on the substrate, and a higher band-gap Group III-nitride (e.g., AlGaN) layer formed on the buffer or channel layer. Respective source, drain, and gate contacts are electrically coupled to the barrier layer. The HEMT relies on a two-dimensional electron gas (2DEG) formed at an interface between the higher band-gap barrier layer and the lower bandgap buffer or channel layer, where the lower bandgap material has a higher electron affinity. The 2DEG is an accumulation layer in the lower bandgap material and can contain a high electron concentration and high electron mobility.

HEMTs fabricated in the Group III-nitride material system have the potential to generate large amounts of RF power because of the combination of material characteristics that includes high breakdown fields, wide bandgaps, large conduction band offset, and/or high saturated electron drift velocity.

However, the device performance implementing semiconductor devices, such as Group III-nitride HEMTs, can be limited by a thermal budget that limits tolerable operational temperatures due to leakage current increases and the like that lead to reducing device life based in part on direct current (DC) stress, radiofrequency (RF) stress, and the like.

Accordingly, there is a need for improving a thermal budget of semiconductor devices.

SUMMARY OF THE DISCLOSURE

One general aspect includes a device including: a substrate, a buffer layer on the substrate, a barrier layer on the buffer layer, a passivation layer on the barrier layer, a source electrically coupled to the barrier layer, a gate electrically coupled to the barrier layer, and a drain electrically coupled to the barrier layer. The gate including at least one first surface connected to at least one second surface through at least one inflection point. The at least one inflection point is arranged within the passivation layer.

One general aspect includes a process of forming a device including: providing a substrate, arranging a buffer layer on the substrate, arranging a barrier layer on the buffer layer, electrically coupling a source to the barrier layer, electrically coupling a gate to the barrier layer, electrically coupling a drain to the barrier layer, forming a passivation layer on the barrier layer, and forming a gate electrically coupled to the barrier layer. The gate including at least one first surface connected to at least one second surface through at least one inflection point. The at least one inflection point is arranged within the passivation layer.

One general aspect includes a device including a substrate, a buffer layer on the substrate, a barrier layer on the buffer layer, a passivation layer on the barrier layer, a source electrically coupled to the barrier layer, a gate electrically coupled to the barrier layer, a drain electrically coupled to the barrier layer, and the gate including at least one step portion. Where the at least one step portion is arranged within the passivation layer.

One general aspect includes a process of forming a device including providing a substrate, arranging a buffer layer on the substrate, arranging a barrier layer on the buffer layer, electrically coupling a source to the barrier layer, electrically coupling a gate to the barrier layer, electrically coupling a drain to the barrier layer, forming a passivation layer on the barrier layer, forming a gate electrically coupled to the barrier layer, and the gate including at least one step portion. Where the at least one step portion is arranged within the passivation layer.

One general aspect includes a device including a substrate, a passivation layer, a source, a gate, a drain, and the gate including at least one step portion. Where the at least one step portion is arranged within the passivation layer, the at least one step portion includes at least one first surface and at least one second surface, where the at least one first surface is connected to the at least one second surface, where the gate includes a third surface, and where the at least one step portion is connected to the third surface.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
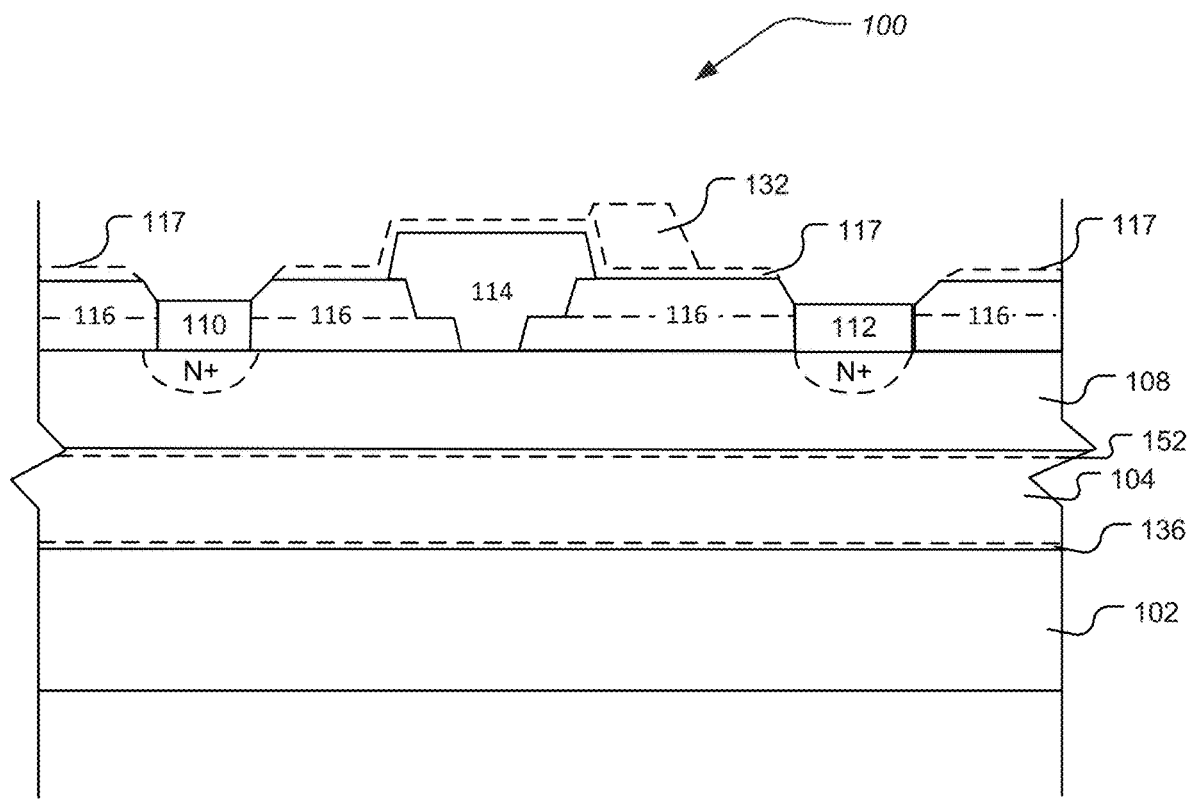
FIG. 1 shows a cross-sectional view of one aspect of a transistor according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition to the type of structure, the characteristics of the semiconductor material from which a transistor is formed may also affect operating parameters. Of the characteristics that affect a transistor's operating parameters, a leakage, a leakage current, and the like may have an effect on a transistor's operational characteristics.

As used herein, leakage is a phenomenon where mobile charge carriers (electrons or holes) flow through a semiconductor, for example in an insulating region. In one aspect, leakage is an undesired phenomenon where mobile charge carriers (electrons or holes) flow through a semiconductor, for example in an insulating region. In one aspect, leakage is a phenomenon where mobile charge carriers (electrons or holes) tunnel through an insulating region. In one aspect, leakage may be characterized as a quantum phenomenon where mobile charge carriers (electrons or holes) tunnel through an insulating region.

The disclosure includes both extrinsic and intrinsic semiconductors. Intrinsic semiconductors are undoped (pure). Extrinsic semiconductors are doped, meaning an agent has been introduced to change the electron and hole carrier concentration of the semiconductor at thermal equilibrium. Both p-type and n-type semiconductors are disclosed, with p-types having a larger hole concentration than electron concentration, and n-types having a larger electron concentration than hole concentration.

Silicon carbide (SiC) has excellent physical and electronic properties, which should theoretically allow production of electronic devices that can operate at higher temperatures, higher power, and higher frequency than devices produced from silicon (Si) or gallium arsenide (GaAs). The high electric breakdown field of about $4 \times E6$ V/cm (volts per centimeter), high saturated electron drift velocity of about $2.0 \times E7$ cm/sec and high thermal conductivity of about 4.9 W/cm–° K indicate that SiC would be suitable for high frequency and high power applications.

As used herein, the term "Group III-nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN, and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as AlxGa1−xN where 1>x>0 are often used to describe these compounds.

Semiconductors, such as Group III-nitride HEMTs need the improvement of a thermal budget that limits tolerable operational temperatures due to increases in leakage current. Increases in leakage current may lead to reducing device life that may be based on in part on DC stress, RF stress, and like. The disclosure presents devices and processes to improve the thermal budget utilizing a modified gate shape. In particular, changing a gate shape may modulate an electromagnetic field in a channel layer, resulting in a lower pinch-off voltage and/or a lower leakage current flow. The disclosure further presents devices and processes utilizing a modified gate shape that may enhance a depletion region in a channel layer, resulting in reducing the leakage current flow.

In some aspects of the disclosure, utilizing the modified gate shape may better control gate leakage current by arranging metal portions of the gate closer to the epitaxial layers while maintaining a gate length. In this regard, in some of implementations maintaining the gate length may maintain a performance at a frequency of interest. On the other hand, implementing a prior art T-shaped gate with metal portions closer to the epitaxial layers may result in capacitance problems. Moreover, when changing the dimensions of the gate to address the capacitance problems, then dimensions of other structures may need to be modified, which leads to other problems. The disclosed modified gate shape allows the gate length to be maintained and may improve gate leakage control while not adversely introducing unwanted capacitances. For example, it may be beneficial to maintain the gate length to ensure the same and/or similar device performance. In particular, increasing a gate length has been found to result in increasing capacitance/or resulting in degrading a cut-off frequency. Additionally, introducing unwanted capacitances may lead to increases in undesired impedance.

FIG. 1 shows a cross-sectional view of one aspect of a transistor according to the disclosure.

In particular, FIG. 1 shows a cross-sectional view of a transistor 100. The transistor 100 may include a source 110, a gate 114, and a drain 112. To protect and separate the gate 114 and the drain 112, a passivation layer 116 may be arranged on the transistor 100. In one aspect, the passivation layer 116 may include one or more layers. As illustrated in FIG. 1, the passivation layer 116 is shown with a dashed line indicating the layered structure of the passivation layer 116. In some aspects, the passivation layer 116 may include more layers than illustrated.

In particular, the gate 114 may be configured, structured, and/or arranged to have a gate shape that may modulate an electromagnetic field in a channel layer, resulting in a lower pinch-off voltage and/or a lower leakage current flow. Moreover, the gate 114 may be configured, structured, and/or arranged to have a gate shape that may enhance a depletion region in a channel layer, resulting in reducing the leakage current flow.

The gate 114 may be formed of platinum (Pt), nickel (Ni), and/or gold (Au). However, other metals known to one skilled in the art to achieve the Schottky effect, may be used. In one aspect, the gate 114 may include a Schottky gate contact that may have a three layer structure. Such a structure may have advantages because of the high adhesion of some materials. In one aspect, the gate 114 may further include an overlayer of highly conductive metal. In one aspect, the gate 114 may be configured as a T-shaped gate. In one aspect, the gate 114 may be configured as a non-T-shaped gate.

The gate 114 may be utilized in various semiconductors, semiconductor based transistor devices, micro-electronic devices, and the like with similar operational improvements. For brevity, the gate 114 will be generally described in an application that may be a Group III-nitride based high-electron mobility transistor (HEMT).

Figure 2:
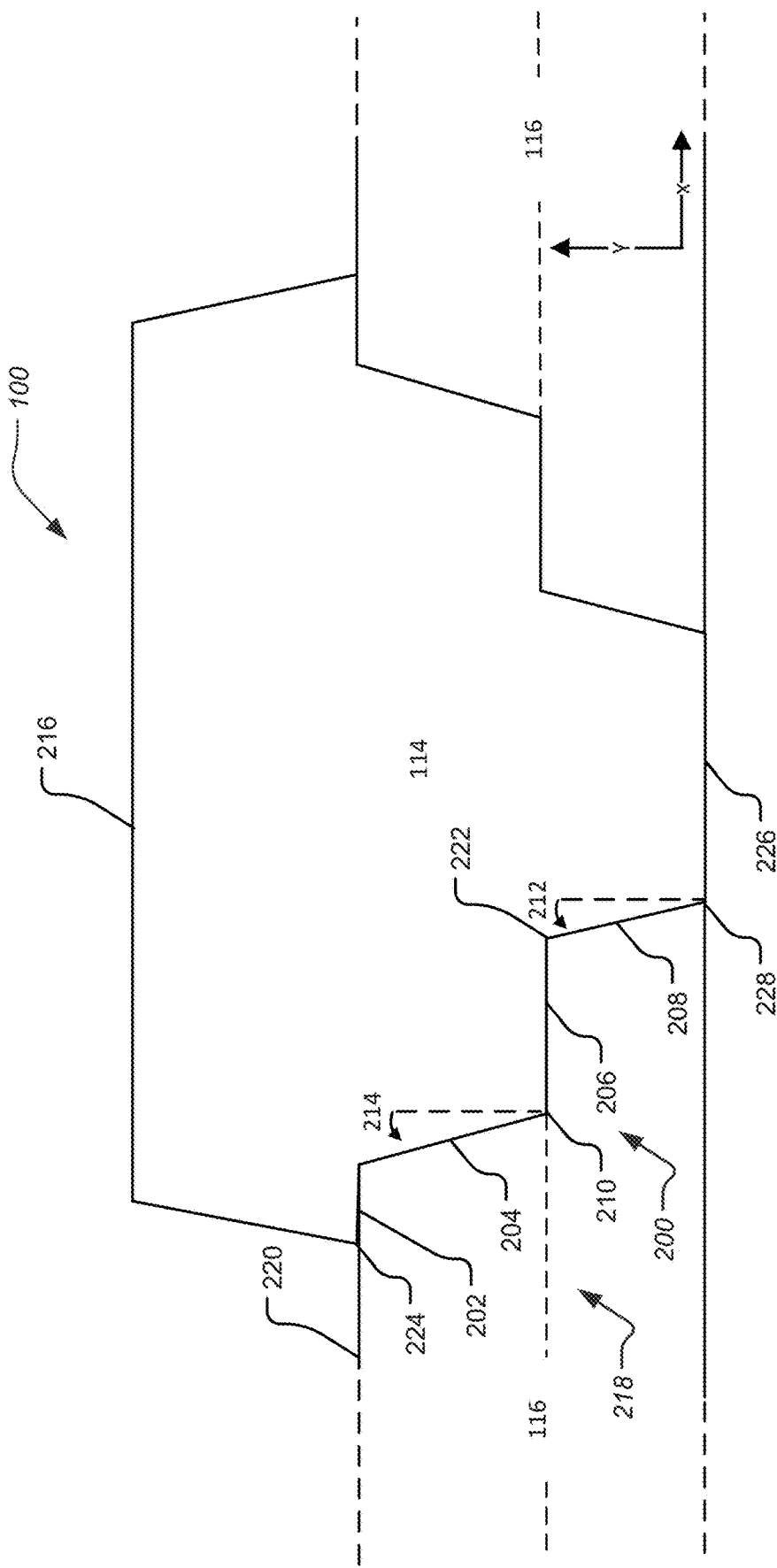
FIG. 2 shows a partial cross-sectional view of the transistor according to FIG. 1.

FIG. 2 shows a partial cross-sectional view of the transistor according to FIG. 1.

In particular, FIG. 2 illustrates one aspect of a shape of the gate 114. The gate 114 may include a portion 216 configured to be arranged above the passivation layer 116; and the gate 114 may include a portion 218 configured to be arranged within the passivation layer 116. In one aspect, the portion 218 of the gate 114 may include a step portion 200. In aspects, the step portion 200 may include a first surface portion connected to a second surface portion. In aspects, the step portion 200 may include a first surface portion connected to a second surface portion with an inflection point 210 between the surfaces. In other aspects, the step portion 200 may define a transition in dimensions in surfaces, transitions between surfaces, and the like associated with an inflection point 210 between the surfaces.

In one aspect, the gate 114 implementing the step portion 200 may be a channel layer electromagnetic field modulation component, a pinch-off voltage lowering component, a leakage current flow lowering component, a component configured to provide channel layer depletion region enhancement, and/or the like. In one aspect, the gate 114 implementing the step portion 200 may be a channel layer electromagnetic field modulation, pinch-off voltage lowering, leakage current flow lowering, channel layer depletion region enhancement component.

In one aspect, the step portion 200 may define in part a gate shape of the gate 114 that may modulate an electromagnetic field in a channel layer, resulting in a lower pinch-off voltage, a lower leakage current flow, and/or the like. Moreover, the step portion 200 may define a gate shape of the gate 114 that may be configured, structured, and/or arranged to have a gate shape that may enhance a depletion region in a channel layer, resulting in reducing the leakage current flow.

In one aspect, the step portion 200 may extend continuously along the edge and/or edges of the gate 114 perpendicular to the X axis and the Y axis. In one aspect, the step portion 200 may extend discontinuously along the edge and/or edges of the gate 114 perpendicular to the X axis and the Y axis. In one aspect, the step portion 200 may extend partially along the edge and/or edges of the gate 114 perpendicular to X axis and the Y axis. In one aspect, the step portion 200 may extend only in selective areas along the edge and/or edges of the gate 114 perpendicular to the X axis and the Y axis.

As described herein, the step portion 200 may be configured with a number of different shapes and configurations. In the aspect of FIG. 2, the step portion 200 may include a first surface 204. The first surface 204 may be inclined with respect to the Y axis and/or the first surface 204 may be inclined with respect to a line perpendicular to an upper surface 220 of the passivation layer 116. As illustrated in FIG. 2, the first surface 204 may be inclined with respect to the dashed line at an angle 214. The angle 214 may be 1°-70°, 1°-5°, 5°-10°, 10°-15°, 15°-20°, 20°-25°, 25°-30°, 30°-35°, 35°-40°, 40°-45°, 45°-50°, 50°-55°, 55°-60°, 60°-65°, or 65°-70°.

In other aspects, the first surface 204 may be parallel to the Y axis, and/or the first surface 204 may be parallel to a line perpendicular to the upper surface 220 of the passivation layer 116.

In the aspect of FIG. 2, the step portion 200 may include a second surface 206. The second surface 206 may be parallel to the X axis and/or the second surface 206 may be parallel to the upper surface 220 of the passivation layer 116.

In other aspects, the second surface 206 may be inclined with respect to the X axis and/or the second surface 206 may be inclined with respect to a line parallel to the upper surface 220 of the passivation layer 116. In this aspect, the second surface 206 may be inclined 1°-10°, 1°-2°, 2°-3°, 3°-4°, 4°-5°, 5°-6°, 6°-7°, 7°-8°, 8°-9°, or 9°-10°.

In one aspect, the first surface 204 may connect to the second surface 206 at an inflection point 210. The inflection point 210 may be a connection, a corner, a curved corner, a change in direction, an area of curvature, an edge, or the like.

In the aspect of FIG. 2, the step portion 200 may connect to a third surface 208. The third surface 208 may be inclined with respect to the Y axis and/or the third surface 208 may be inclined with respect to a line perpendicular to the upper surface 220 of the passivation layer 116. As illustrated in FIG. 2, the third surface 208 may be inclined with respect to the dashed line at an angle 212. The angle 212 may be 1°-70°, 1°-5°, 5°-10°, 10°-15°, 15°-20°, 20°-25°, 25°-30°, 30°-35°, 35°-40°, 40°-45°, 45°-50°, 50°-55°, 55°-60°, 60°-65°, or 65°-70°

In other aspects, the third surface 208 may be parallel to the Y axis, and/or the third surface 208 may be parallel to a line perpendicular to the upper surface 220 of the passivation layer 116. In one aspect, the third surface 208 may extend to a bottom surface 226 of the gate 114. In one aspect, the third surface 208 may connect to the bottom surface 226 at a junction 228. The junction 228 may be a connection, a corner, a curved corner, an edge, or the like.

In one aspect, the second surface 206 may connect to the third surface 208 at a junction 222. The junction 222 may be a connection, a corner, a curved corner, an edge, a change in direction, an area of curvature, or the like.

The first surface 204 and/or the step portion 200 may connect to a surface 202 that may be arranged parallel to an upper surface of the passivation layer 116 and/or the surface 202 that may be arranged parallel to X axis as illustrated in FIG. 2. In one aspect, the surface 202 may be arranged along an upper surface 220 of the passivation layer 116. In one aspect, the surface 202 may be arranged above an upper surface 220 of the passivation layer 116. In one aspect, the surface 202 may be arranged below an upper surface 220 of the passivation layer 116. The surface 202 may connect to the portion 216 at a junction 224. The junction 224 may be a connection, a corner, a curved corner, an edge, or the like. In other aspects, the surface 202 may be inclined with respect to the X axis and/or the surface 202 may be inclined with respect to a line parallel to the upper surface 220 of the passivation layer 116. In this aspect, the surface 202 may be inclined 1°-10°, 1°-2°-3°, 3°-4°, 4°-5°, 5°-6°, 6°-7°, 7°-8°, 8°-9°, or 9°-10°.

The gate 114 may include the portion 216 configured to be arranged above the passivation layer 116. As illustrated in FIG. 2, the portion 216 may be symmetrical about a Y axis. In other aspects, the portion 216 may be asymmetrical about the Y axis.

In one aspect, the portion 218 may be symmetrical about a line parallel to the Y axis as illustrated in FIG. 2. In one aspect, the portion 218 may be asymmetrical about a line parallel to the Y axis (not shown). In one aspect, the step portion 200 may be symmetrical about a line parallel to the Y axis as illustrated in FIG. 2. In one aspect, the step portion 200 may be asymmetrical about a line parallel to the Y axis (not shown).

Figure 3:
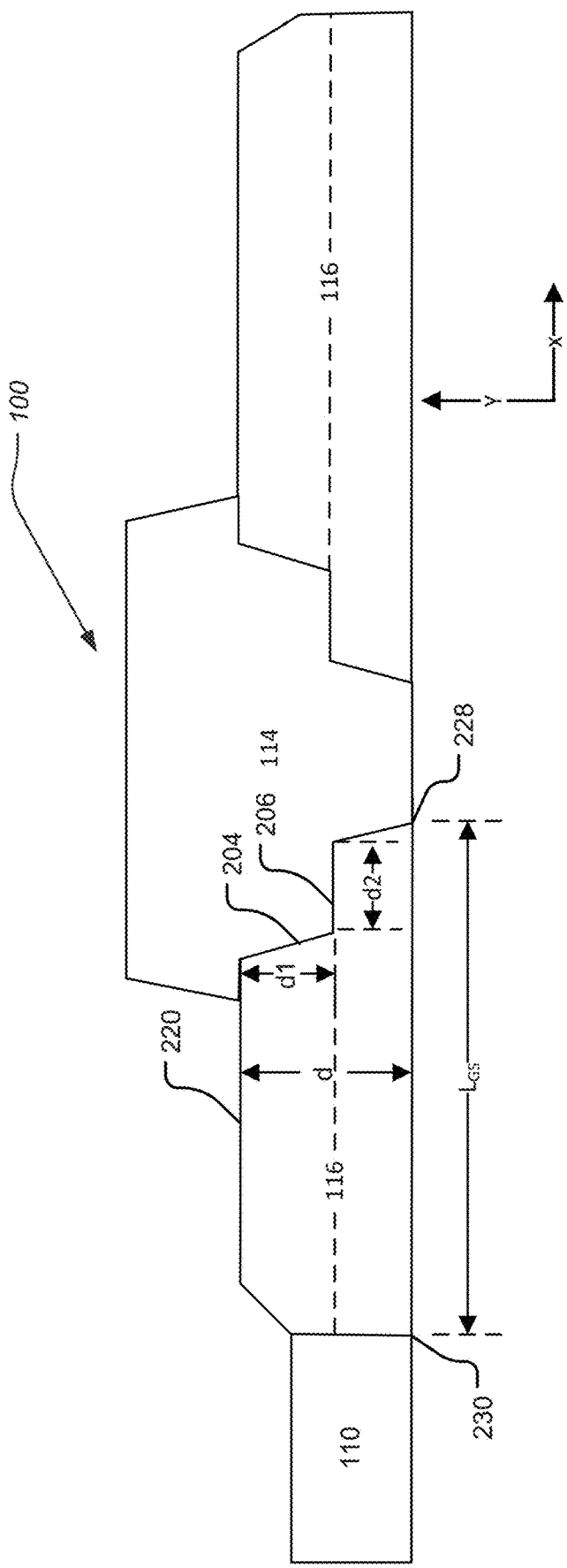
FIG. 3 shows a partial cross-sectional view of the transistor according to FIG. 1.

FIG. 3 shows a partial cross-sectional view of the transistor according to FIG. 1.

In particular, FIG. 3 illustrates exemplary dimensions of the first surface 204 and the second surface 206. A depth of the first surface 204 may be defined as a depth d1. The depth d1 may be taken along a line parallel to the Y axis, and/or a line parallel to a line perpendicular to the upper surface 220 of the passivation layer 116. Moreover, the depth d1 may be defined as a percentage of the depth d of the passivation layer 116. In aspects, the depth d1 may be 10%-80% of the depth d, 10%-20% of the depth d, 20%-30% of the depth d, 30%-40% of the depth d, 40% 45% of the depth d, 45%-50% of the depth d, 45%-55% of the depth d, 50%-55% of the depth d, 50%-60% of the depth d, 60%-70% of the depth d, or 70%-80% of the depth d.

A depth of the second surface 206 may be defined as a depth d2. The depth d2 may be taken along a line parallel to the X axis, and/or a line parallel to the upper surface 220 of the passivation layer 116. Moreover, the depth d2 may be defined as a percentage of a distance LGS defined as a length between the gate 114 and the source 110. In one aspect, the distance LGS may be defined as a length between a lower left edge (junction 228) of the gate 114 and a lower right edge 230 of the source 110 as illustrated in FIG. 3.

In aspects, the depth d2 may be 5%-80% of the distance LGS, 5%-10% of the distance LGS, 10%-20% of the distance LGS, 20%-30% of the distance LGS, 30%-40% of the distance LGS, 40%-50% of the distance LGS, 45%-55% of the distance LGS, 50%-55% of the distance LGS, 50%-60% of the distance LGS, 60%-70% of the distance LGS, or 70%-80% of the distance LGS.

In aspects of the disclosure, a shape of the gate 114 may be defined by the passivation layer 116. In one aspect, the passivation layer 116 may be shaped and the gate 114 deposited thereon. In one aspect, the passivation layer 116 may be etched and the gate 114 deposited thereon. In one aspect, the passivation layer 116 may include one or more layers and one or more layers may be etched and gate metals may be deposited thereon for formation of the gate 114. In one aspect, the passivation layer 116 may include one or more layers; the one or more layers may be etched to form a shape of the gate 114; and the gate 114 may be deposited thereon. In one aspect, the passivation layer 116 may include one or more layers; the one or more layers may be each etched to form a step; and gate metals may be deposited thereon for formation of the gate 114. In one aspect, an etching process may include one or more photo-lithographic masks. In one aspect, the passivation layer 116 may be etched and the gate 114 deposited such that the bottom surface 226 of the gate 114 is on or adjacent a surface of a barrier layer 108. In one aspect, a metal forming the gate 114 may be patterned to extend across passivation layer 116. In other aspects, a shape of the gate 114 may be formed and/or defined utilizing other methodologies.

With reference back to FIG. 1, the transistor 100 may be implemented as a HEMT and may include a substrate layer 102 and a buffer layer 104. The transistor 100 may further include a barrier layer 108 arranged on the buffer layer 104. In one aspect, the barrier layer 108 may be arranged directly on the buffer layer 104.

In one aspect, a bandgap of the buffer layer 104 may be less than a bandgap of the barrier layer 108 to form a two-dimensional electron gas (2DEG) at a heterointerface 152 between the buffer layer 104 and barrier layer 108 when biased at an appropriate level. In one aspect, the buffer layer 104 is a Group III-nitride material, such as GaN, and the barrier layer 108 is a Group III-nitride material, such as AlGaN or AlN. In some aspects, there may be intervening layer(s) or region(s) between the substrate layer 102 and the buffer layer 104, such as a nucleation layer 136. In one aspect, there may be intervening layer(s) or region(s) (not shown) between the buffer layer 104 and the barrier layer 108. In one aspect, the barrier layer 108 is made of multiple layers, such as an AlN barrier layer on the buffer layer 104, and an AlGaN layer on the AlN barrier layer. In one aspect, there are intervening layer(s) or region(s) between the barrier layer 108 and a passivation layer 116 and/or the source 110, the gate 114 and/or the drain 112. In one aspect, the composition of these layers can be step-wise or continuously graded. In one aspect, the barrier layer 108 can start with a higher percentage of Al near the buffer layer 104 and decrease in Al percentage away from the buffer layer 104.

In aspects of the transistor 100 of the disclosure, a gate contact may be provided for the gate 114 in between the source 110 and the drain 112. Furthermore, in certain aspects of the disclosure, the gate contact may be disposed on the barrier layer 108. In one aspect, the gate contact may be disposed directly on the barrier layer 108.

Figure 4:
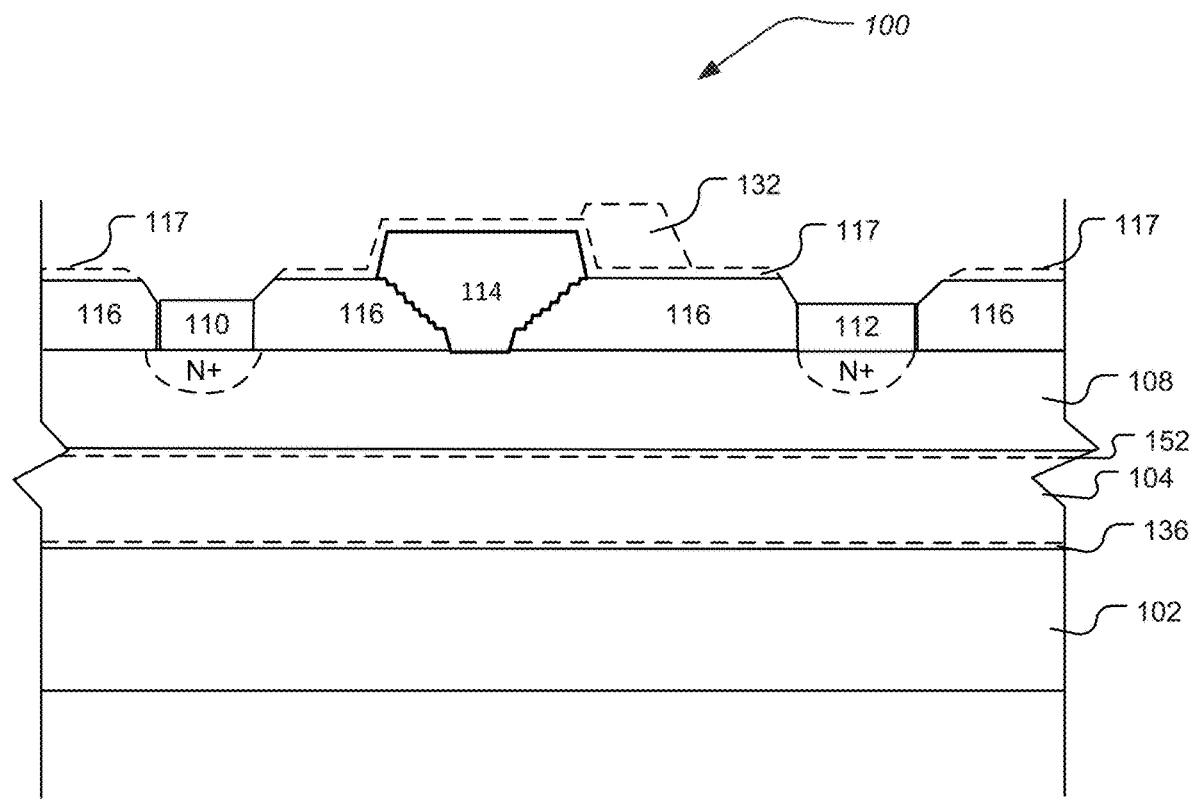
FIG. 4 shows a cross-sectional view of one aspect of a transistor according to the disclosure.

FIG. 4 shows a cross-sectional view of one aspect of a transistor according to the disclosure.

In particular, FIG. 4 is a transistor 100 that may include any one or more of the features of the disclosure. More specifically, the transistor 100 of FIG. 4 may include a gate 114 that may be configured, structured, and/or arranged to have a gate shape that may modulate an electromagnetic field in a channel layer, resulting in a lower pinch-off voltage and/or a lower leakage current flow. Moreover, the gate 114 may be configured, structured, and/or arranged to have a gate shape that may enhance a depletion region in a channel layer, resulting in reducing the leakage current flow. In one aspect of FIG. 4, the passivation layer 116 may include one or more layers (not shown for purposes of clarity only).

Figure 5:
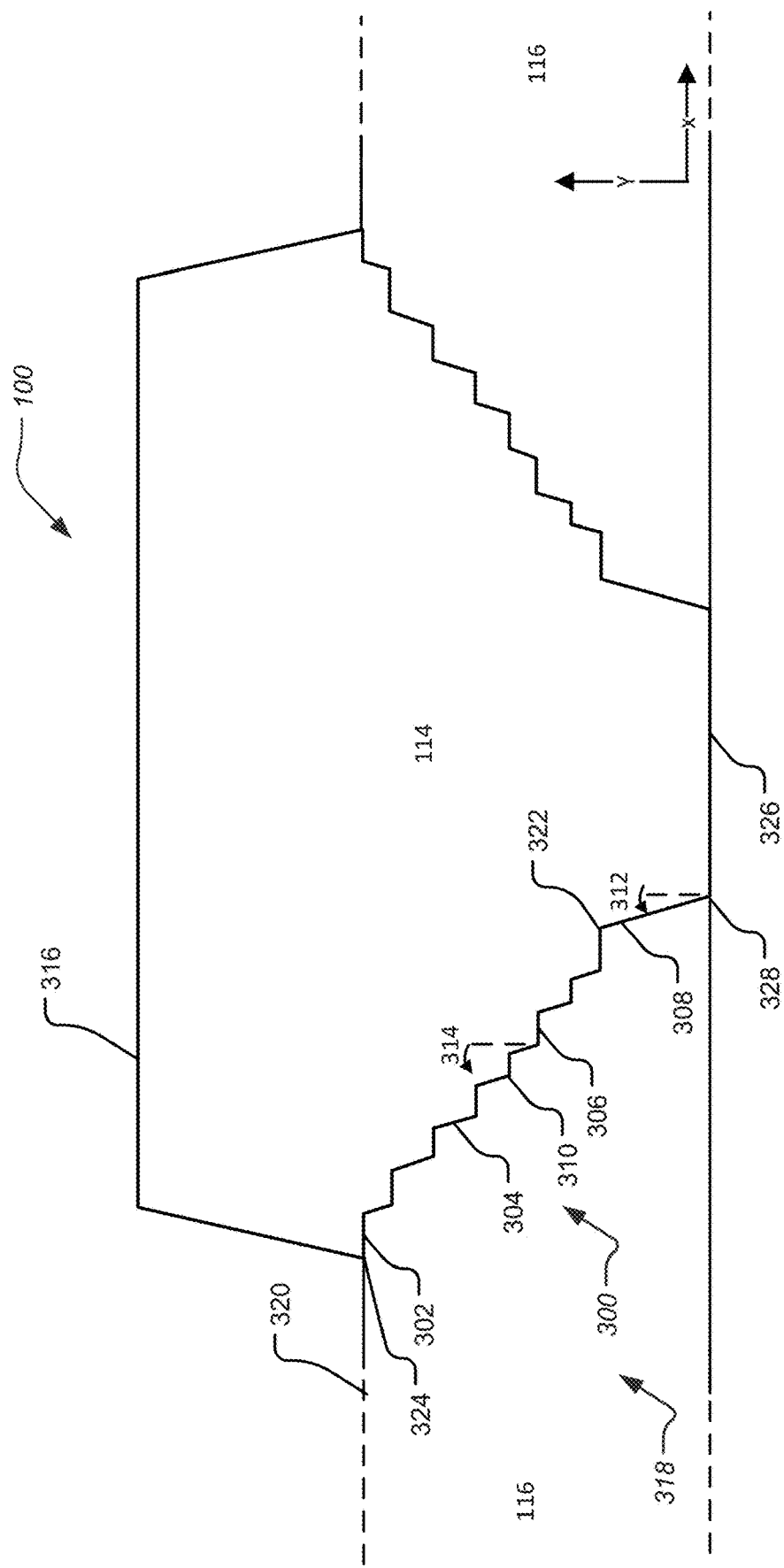
FIG. 5 shows a partial cross-sectional view of the transistor according to FIG. 4.

FIG. 5 shows a partial cross-sectional view of the transistor according to FIG. 4.

In particular, FIG. 5 illustrates one aspect of a shape of the gate 114. The gate 114 may include a portion 316 configured to be arranged above the passivation layer 116; and the gate 114 may include a portion 318 configured to be arranged within the passivation layer 116. In one aspect, the portion 318 of the gate 114 may include the step portions 300. In aspects, the step portions 300 may include one or more connected surface portions. In aspects, the step portions 300 may include one or more connected surface portions having an inflection point between the surfaces. In other aspects, the step portions 300 may define transitions in dimensions in surfaces, transitions between surfaces, and the like associated with an inflection point between the surfaces.

In one aspect, the gate 114 implementing the step portions 300 may be a channel layer electromagnetic field modulation component, a pinch-off voltage lowering component, a leakage current flow lowering component, a component configured to provide channel layer depletion region enhancement, and/or the like. In one aspect, the gate 114 implementing the step portions 300 may be a channel layer electromagnetic field modulation, pinch-off voltage lowering, leakage current flow lowering, channel layer depletion region enhancement component.

In one aspect, the step portions 300 may define in part a gate shape of the gate 114 that may modulate an electromagnetic field in a channel layer, resulting in a lower pinch-off voltage, a lower leakage current flow, and/or the like. Moreover, the step portions 300 may define a gate shape of the gate 114 that may be configured, structured, and/or arranged to have a gate shape that may enhance a depletion region in a channel layer, resulting in reducing the leakage current flow.

In one aspect, there may be N number of the step portions 300, where N is a positive integer. In particular, N may be 2-30 step portions 300, 2-4 step portions 300, 4-6 step portions 300, 6-8 step portions 300, 8-10 step portions 300, 10-12 step portions 300, 12-14 step portions 300, 14-16 step portions 300, 16-20 step portions 300, 20-24 step portions 300, or 24-30 step portions 300.

In one aspect, the step portions 300 may extend continuously along the edge and/or edges of the gate 114 perpendicular to the X axis and the Y axis. In one aspect, the step portions 300 may extend discontinuously along the edge and/or edges of the gate 114 perpendicular to the X axis and the Y axis. In one aspect, the step portions 300 may extend partially along the edge and/or edges of the gate 114 perpendicular to X axis and the Y axis. In one aspect, the step portions 300 may extend only in selective areas along the edge and/or edges of the gate 114 perpendicular to the X axis and the Y axis.

As described herein, the step portions 300 may be configured with a number of different shapes and configurations. In the aspect of FIG. 5, the step portions 300 may include first surfaces 304. The first surfaces 304 may be inclined with respect to the Y axis and/or the first surfaces 304 may be inclined with respect to a line perpendicular to the upper surface 320 of the passivation layer 116. As illustrated in FIG. 5, the first surfaces 304 may be inclined with respect to the dashed line at an angle 314. The angle 314 may be 1°-70°, 1°-5°, 5°-10°, 10°-15°, 15°-20°, 20° 25°, 25°-30°, 30°-35°, 35°-40°, 40°-45°, 45°-50°, 50°-55°, 55°-60°, 60°-65°, or 65°-70°. In one aspect, the first surfaces 304 may be implemented with the same angle 314. In one aspect, one or more the first surfaces 304 may be implemented with a different one of the angle 314.

In other aspects, one or more of the first surfaces 304 may be parallel to the Y axis, and/or one or more the first surfaces 304 may be parallel to a line perpendicular to the upper surface 320 of the passivation layer 116.

In the aspect of FIG. 5, the step portions 300 may include second surfaces 306. One or more of the second surfaces 306 may be parallel to the X axis and/or the second surfaces 306 may be parallel to the upper surface 320 of the passivation layer 116.

In other aspects, one or more of the second surfaces 306 may be inclined with respect to the X axis and/or the second surfaces 306 may be inclined with respect to a line parallel to the upper surface 320 of the passivation layer 116. In this aspect, one or more the second surfaces 306 may be inclined 1°-10°, 1°-2°, 2°-3°, 3°-4°, 4°-5°, 5°-6°, 6°-7°, 7°-8°, 8°-9°, or 9°-10°.

In one aspect, the first surfaces 304 may connect to the second surfaces 306 at junctions 310. The junctions 310 may be a connection, a corner, a curved corner, an edge, or the like.

In the aspect of FIG. 5, one of the step portions 300 may connect to a third surface 308. The third surface 308 may be inclined with respect to the Y axis and/or the third surface 308 may be inclined with respect to a line perpendicular to an upper surface 320 of the passivation layer 116. As illustrated in FIG. 5, the third surface 308 may be inclined with respect to the dashed line at an angle 312. The angle 312 may be 1°-70°, 1°-5°, 5°-10°, 10°-15°, 15°-20°, 20°-25°, 25°-30°, 30°-35°, 35°-40°, 40°-45°, 45°-50°, 50°-55°, 55°-60°, 60°-65°, or 65°-70°

In other aspects, the third surface 308 may be parallel to the Y axis, and/or the third surface 308 may be parallel to a line perpendicular to the upper surface 320 of the passivation layer 116.

In one aspect, one of the second surfaces 306 may connect to the third surface 308 at a junction 322. The junction 322 may be a connection, a corner, a curved corner, an edge, or the like. In one aspect, the third surface 308 may extend to a bottom surface 326 of the gate 114. In one aspect, the third surface 308 may connect to the bottom surface 326 at a junction 328. The junction 328 may be a connection, a corner, a curved corner, an edge, or the like.

One of first surfaces 304 may connect to a surface 302 that may be arranged parallel to an upper surface of the passivation layer 116 and/or the surface 302 that may be arranged parallel to X axis as illustrated in FIG. 5. In one aspect, the surface 302 may be arranged along an upper surface 320 of the passivation layer 116. In one aspect, the surface 302 may be arranged above an upper surface 320 of the passivation layer 116. In one aspect, the surface 302 may be arranged below an upper surface 320 of the passivation layer 116. The surface 302 may connect to the portion 316 at a junction 324. The junction 324 may be a connection, a corner, a curved corner, an edge, or the like. In other aspects, the surface 302 may be inclined with respect to the X axis and/or the surface 302 may be inclined with respect to a line parallel to the upper surface 320 of the passivation layer 116. In this aspect, the surface 302 may be inclined 1°-10°, 1°-2°, 2°-3°, 3°-4°, 4°-5°, 5°-6°, 6°-7°, 7°-8°, 8°-9°, or 9°-10°.

The gate 114 may include the portion 316 configured to be arranged above the passivation layer 116. As illustrated in FIG. 5, the portion 316 may be symmetrical about a Y axis. In other aspects, the portion 316 may be asymmetrical about the Y axis.

In one aspect, the portion 318 may be symmetrical about a line parallel to the Y axis as illustrated in FIG. 5. In one aspect, the portion 318 may be asymmetrical about a line parallel to the Y axis (not shown). In one aspect, the step portions 300 may be symmetrical about a line parallel to the Y axis as illustrated in FIG. 5. In one aspect, the step portions 300 may be asymmetrical about a line parallel to the Y axis (not shown).

Figure 6:
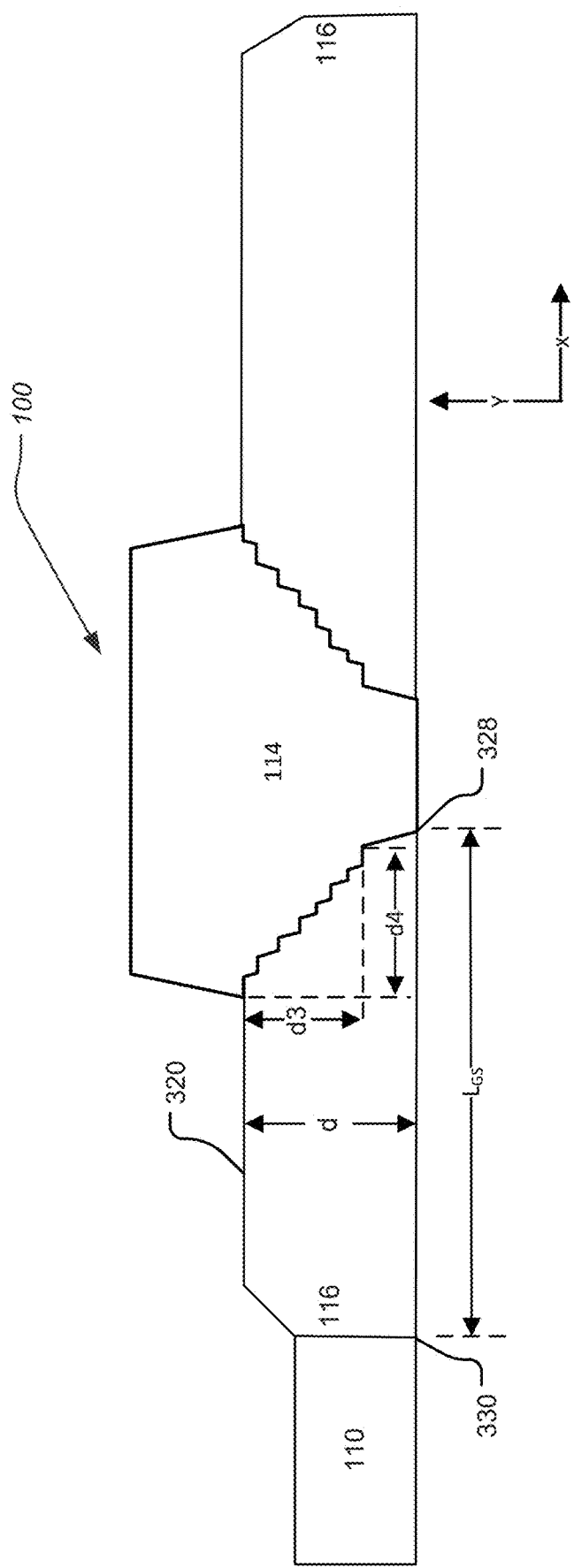
FIG. 6 shows a partial cross-sectional view of the transistor according to FIG. 4.

FIG. 6 shows a partial cross-sectional view of the transistor according to FIG. 4.

In particular, FIG. 6 illustrates exemplary dimensions of the first surfaces 304 and the second surfaces 306. A depth of the first surfaces 304 may be defined as a depth d3. The depth d3 may be taken along a line parallel to the Y axis, and/or a line parallel to a line perpendicular to the upper surface 320 of the passivation layer 116. Moreover, the depth d3 may be defined as a percentage of the depth d of the passivation layer 116. In aspects, the depth d3 may be 10%-80% of the depth d, 10%-20% of the depth d, 20%-30% of the depth d, 30%-40% of the depth d, 40% 45% of the depth d, 45%-50% of the depth d, 45%-55% of the depth d, 50%-55% of the depth d, 50%-60% of the depth d, 60%-70% of the depth d, or 70%-80% of the depth d.

A depth of the second surfaces 306 may be defined as a depth d4. The depth d4 may be taken along a line parallel to the X axis, and/or a line parallel to the upper surface 320 of the passivation layer 116. Moreover, the depth d4 may be defined as a percentage of a distance LGS defined as a length between the gate 114 and the source 110. In one aspect, the distance LGS may be defined as a length between a lower left edge (junction 328) of the gate 114 and a lower right edge 330 of the source 110 as illustrated in FIG. 6.

In aspects, the depth d4 may be 5%-80% of the distance LGS, 5%-10% of the distance LGS, 10%-20% of the distance LGS, 20%-30% of the distance LGS, 30%-40% of the distance LGS, 40%-50% of the distance LGS, 45%-55% of the distance LGS, 50%-55% of the distance LGS, 50%-60% of the distance LGS, 60%-70% of the distance LGS, or 70%-80% of the distance LGS.

Figure 7:
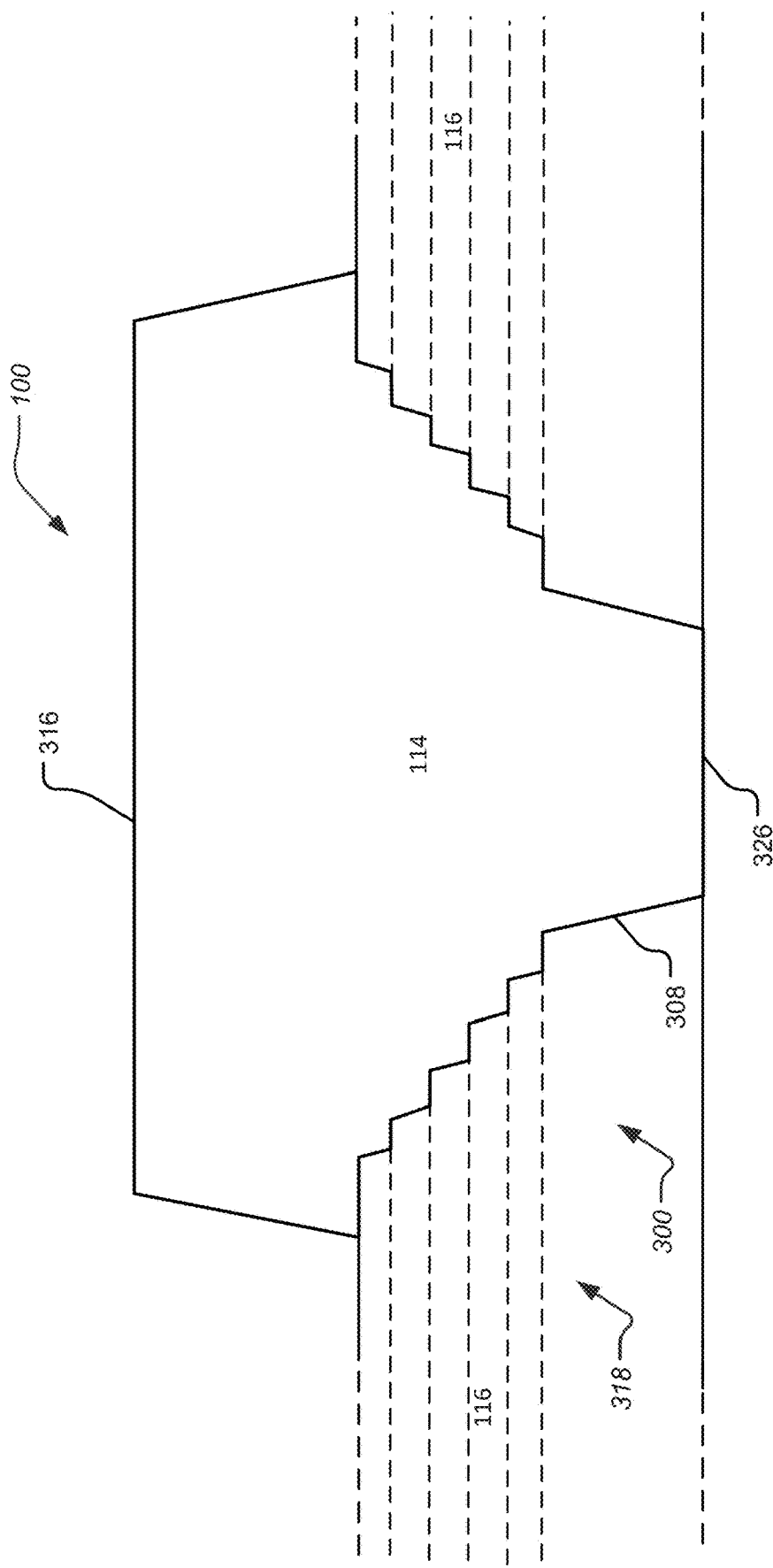
FIG. 7 shows a partial cross-sectional view of a transistor according to the disclosure.

FIG. 7 shows a partial cross-sectional view of a transistor according to the disclosure.

Figure 13:
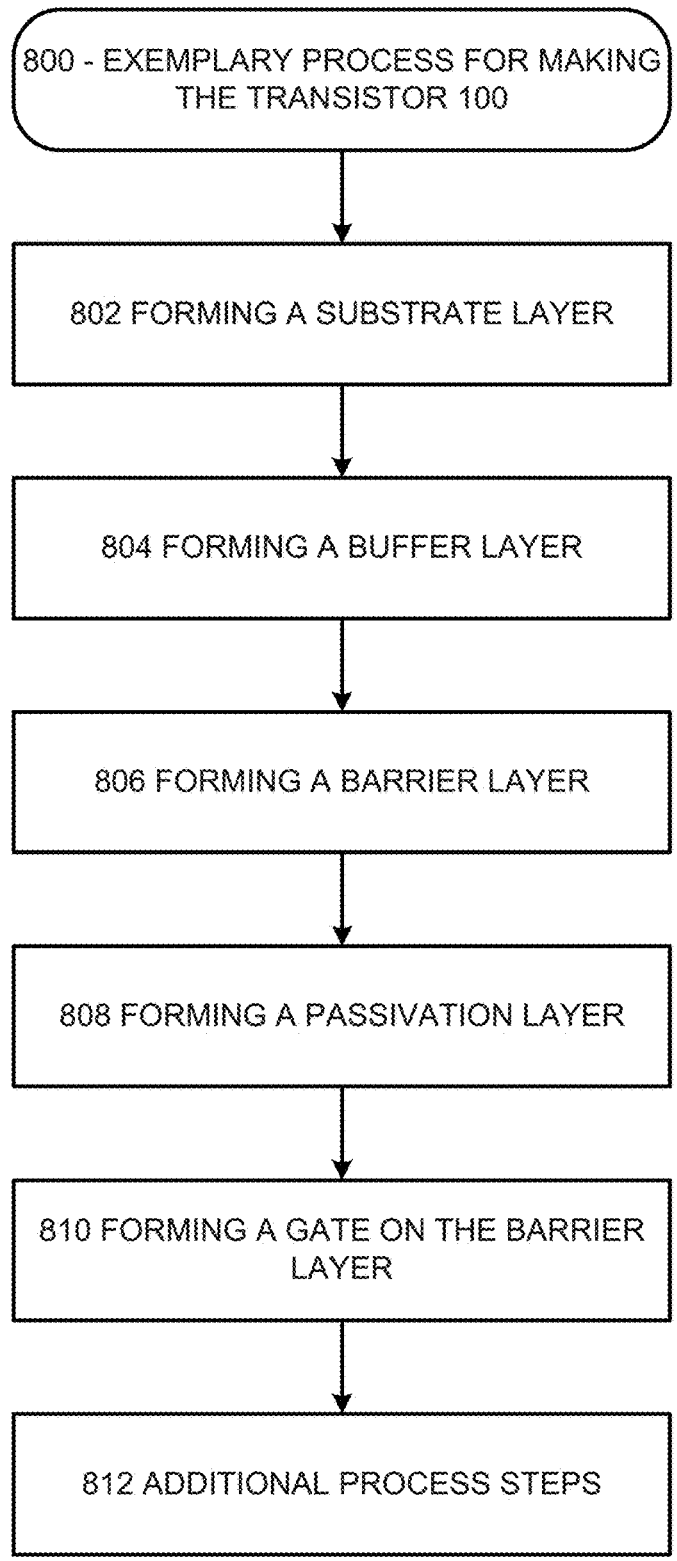
FIG. 13 shows a process of making a transistor according to the disclosure.

In particular, FIG. 7 illustrates one aspect of a shape of the gate 114. The gate 114 may include a portion 316 configured to be arranged above the passivation layer 116; and the gate 114 may include a portion 318 configured to be arranged within the passivation layer 116. In one aspect, the portion 318 of the gate 114 may include the step portions 300. In one aspect, the passivation layer 116 may include one or more layers. As illustrated in FIG. 13, the passivation layer 116 is shown with dashed lines indicating the layered structure of the passivation layer 116. In some aspects, the passivation layer 116 may include more or less layers than illustrated.

Figure 8:
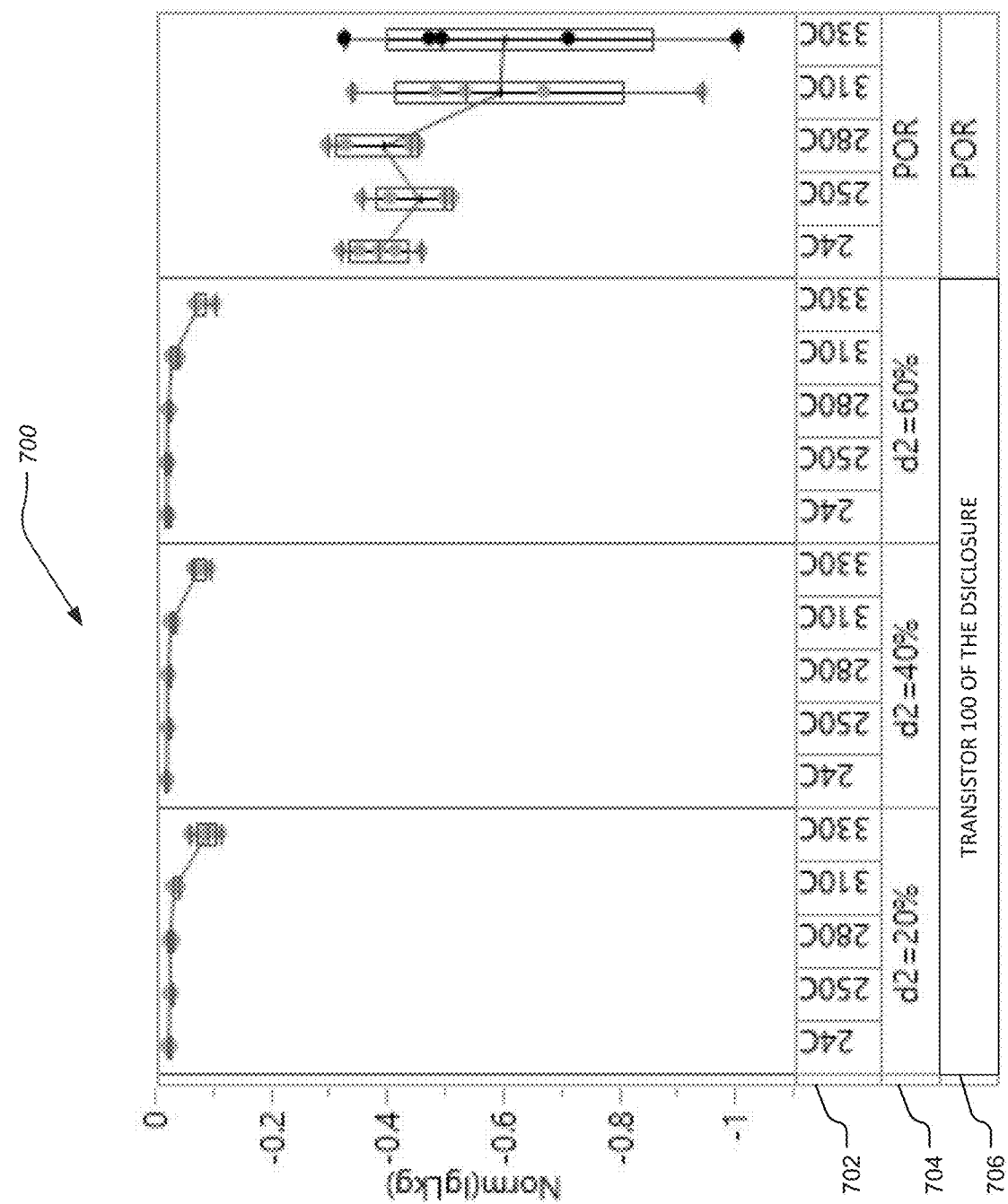
FIG. 8 shows a comparison between a process of record (POR) transistor and transistors according to the disclosure.

FIG. 8 shows a comparison between a process of record (POR) transistor and transistors according to the disclosure.

In particular, FIG. 8 shows a graph 700 that illustrates a comparison between a process of record (POR) transistor and transistors according to the disclosure. The Y axis of the graph 700 references normalized leakage current (Norm (IgLkg)) where values closer to 0 are indicative of less leakage current through a transistor. The X axis references a test level temperature 702, a depth d2 of the gate 114 in percent 704, and an indication of the transistor tested 706. More specifically, the left three graphs relate to a transistor 100 of FIGS. 1-3 implementing the gate 114 (depth d2 equals 20%, depth d2 equals 40%, and depth d2 equals 60% respectively); and the rightmost graph relates to a transistor similar to the transistor 100 implementing a prior art gate configuration.

In particular, FIG. 8 illustrates that the transistor 100 of the disclosure implementing the gate 114 (depth d2 equals 20%, depth d2 equals 40%, and depth d2 equals 60% respectively) exhibited a normalized leakage current (Norm (IgLkg)) between 0 and −0.2. Moreover, FIG. 8 illustrates that the process of record (POR) transistor implementing a prior art gate configuration exhibited a normalized leakage current (Norm(IgLkg)) between −0.3 and −1.

Accordingly, as normalized leakage current (Norm(IgLkg)) values closer to 0 are indicative of less leakage current through a transistor, FIG. 8 illustrates that the transistor 100 of the disclosure implementing the gate 114 (depth d2 equals 20%, depth d2 equals 40%, and depth d2 equals 60% respectively) exhibits less leakage current than the process of record (POR) transistor implementing a prior art gate configuration. In particular, FIG. 8 illustrates that the transistor 100 of the disclosure implementing the gate 114 (depth d2 equals 20%, depth d2 equals 40%, and depth d2 equals 60% respectively) exhibits lower leakage current flow over the temperature variation in comparison to the process of record (POR) transistor implementing a prior art gate configuration. More specifically, FIG. 8 illustrates that the transistor 100 of the disclosure implementing the gate 114 (depth d2 equals 20%, depth d2 equals 40%, and depth d2 equals 60% respectively) exhibits lower leakage current flow over the temperature variation in comparison to the process of record (POR) transistor implementing a prior art gate configuration, which results in an improved thermal budget. In this regard, the leakage current flow may be 1 to 10 times less, 1 to 2 times less, 2 to 4 times less, 4 to 6 times less, 6 to 8 times less, or 8 to 10 times less.

It is contemplated that the various gate shape configurations of the disclosure should provide likewise beneficial reductions in leakage current through the transistor 100 of the disclosure. Moreover, it is contemplated that the various gate shape configurations of the disclosure should provide likewise beneficial reductions in leakage current through other similar micro-electronic devices, other transistors, other semiconductor devices, and the like.

Figure 9:
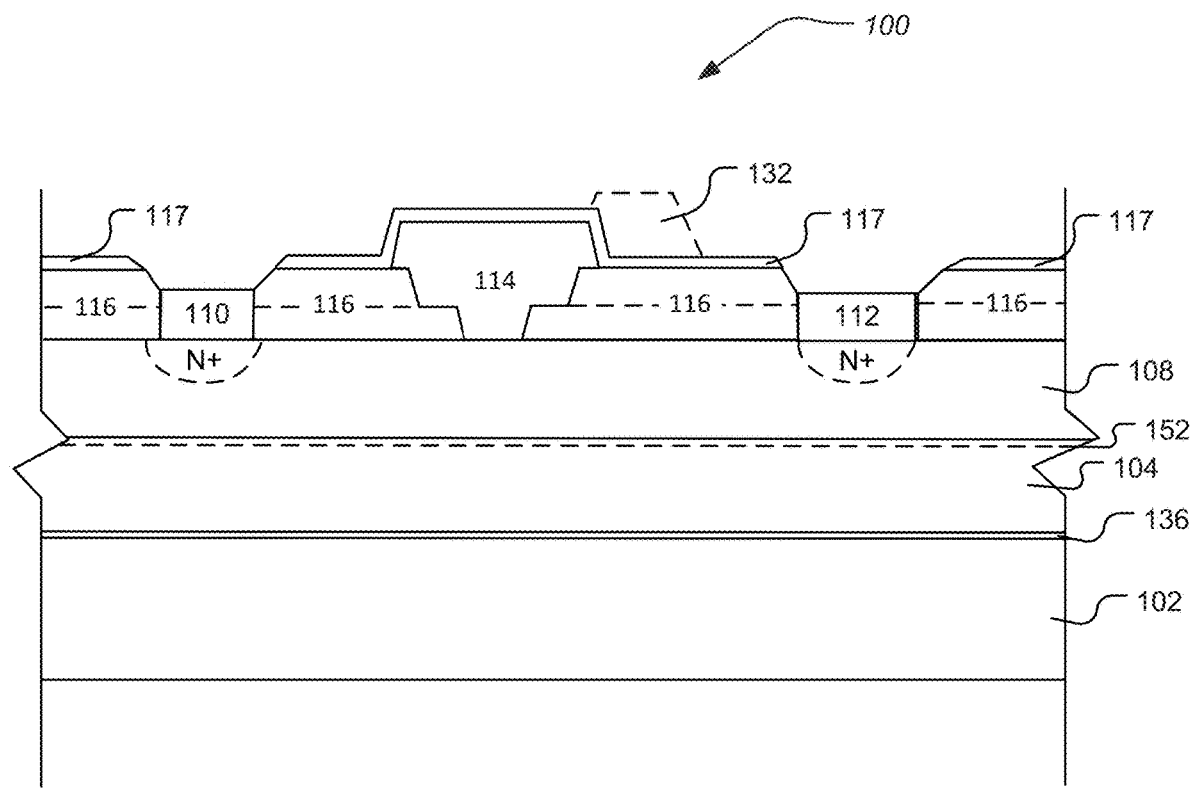
FIG. 9 shows a cross-sectional view of another aspect of a transistor according to the disclosure.

FIG. 9 shows a cross-sectional view of another aspect of a transistor according to the disclosure.

In particular, FIG. 9 is a transistor 100 that may include any one or more of the features of the disclosure. In one aspect, the transistor 100 of FIG. 9 may include one or more of the features of the disclosure illustrated in FIG. 1, FIG. 2, and FIG. 3 and the description thereof. FIG. 9 further illustrates that the transistor 100 may include a spacer layer 117 and may include a nucleation layer 136.

Figure 10:
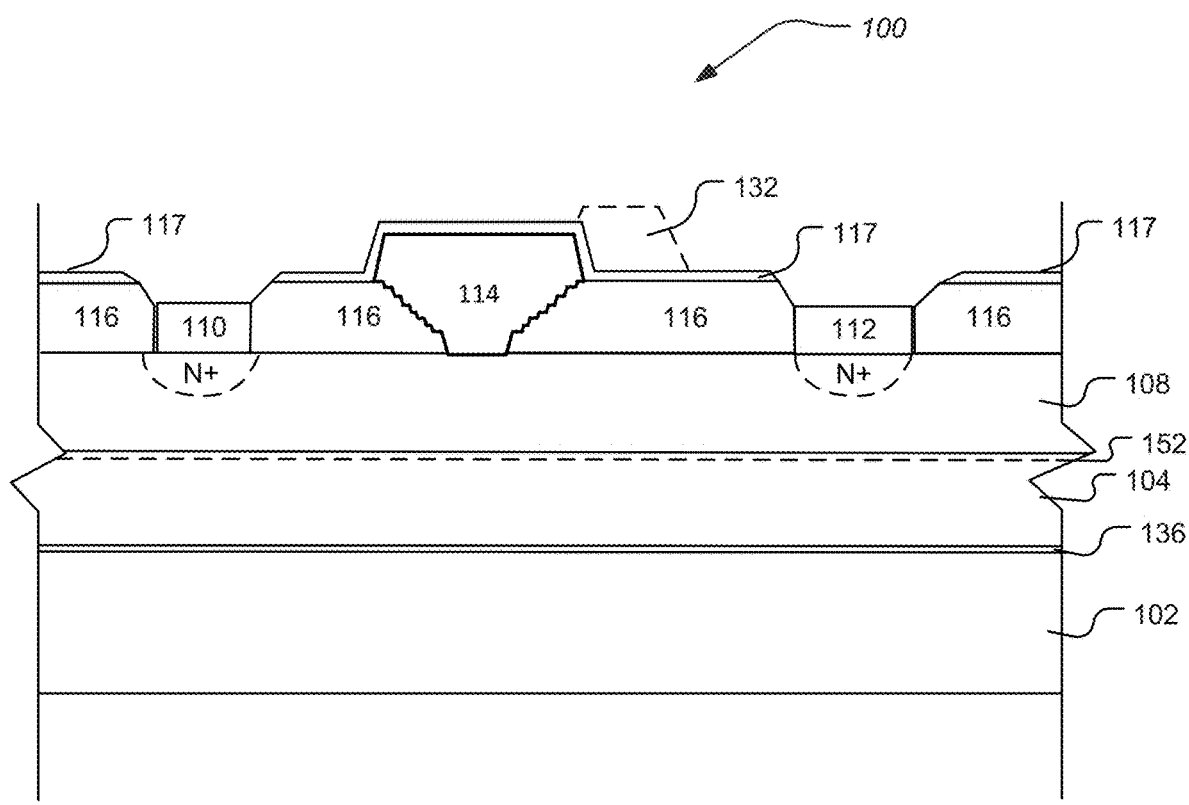
FIG. 10 shows a cross-sectional view of another aspect of a transistor according to the disclosure.

FIG. 10 shows a cross-sectional view of another aspect of a transistor according to the disclosure.

In particular, FIG. 10 is a transistor 100 that may include any one or more of the features of the disclosure. In one aspect, the transistor 100 of FIG. 10 include one or more of the features of the disclosure illustrated in FIG. 4, FIG. 5, and FIG. 6 and the description thereof. FIG. 10 further illustrates that the transistor 100 may include a spacer layer 117 and may include a nucleation layer 136.

Figure 11:
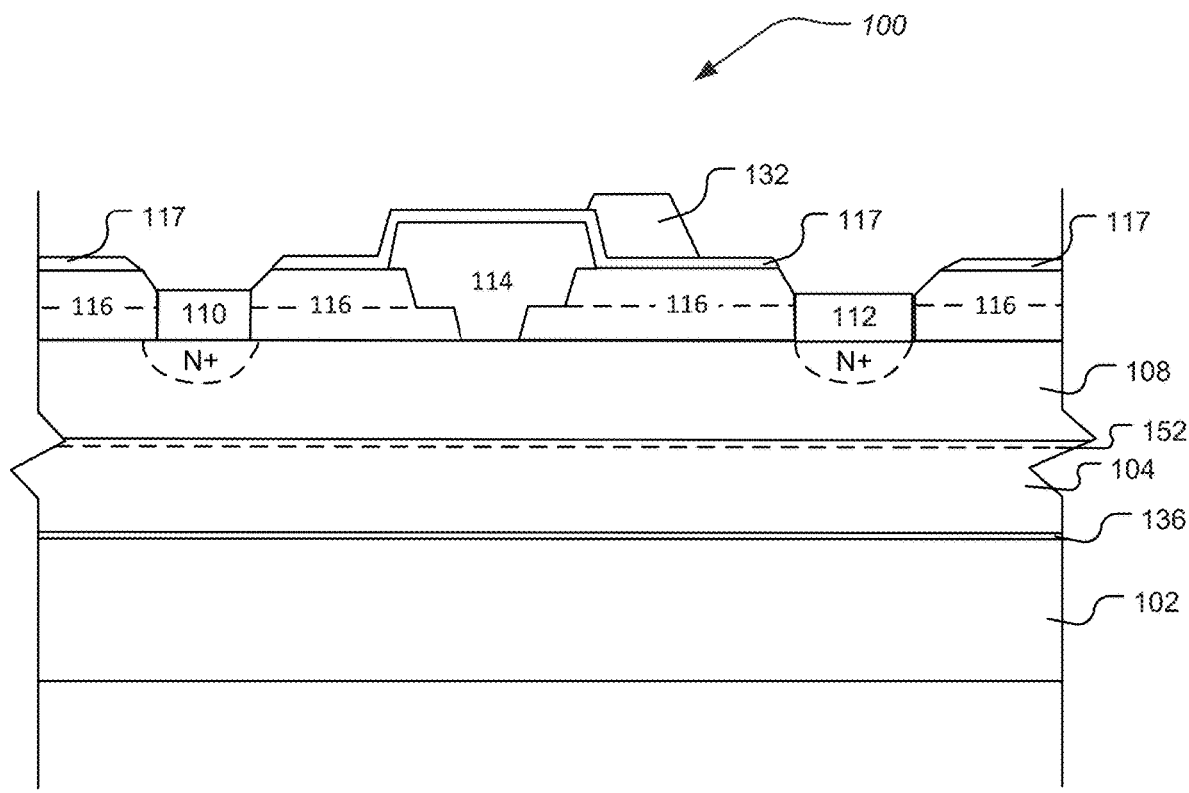
FIG. 11 shows a cross-sectional view of another aspect of a transistor according to the disclosure.

FIG. 11 shows a cross-sectional view of another aspect of a transistor according to the disclosure.

In particular, FIG. 11 illustrates a transistor 100 that may include any one or more of the features of the disclosure. In one aspect, the transistor 100 of FIG. 11 may include one or more of the features of the disclosure illustrated in FIG. 1, FIG. 2, and FIG. 3 and the description thereof. FIG. 11 further illustrates that the transistor 100 may include a spacer layer 117, a field plate 132, and a nucleation layer 136. In one aspect, a plurality of the field plates 132 may be used and each of the plurality of field plates 132 may be stacked with a dielectric material therebetween (not shown).

Figure 12:
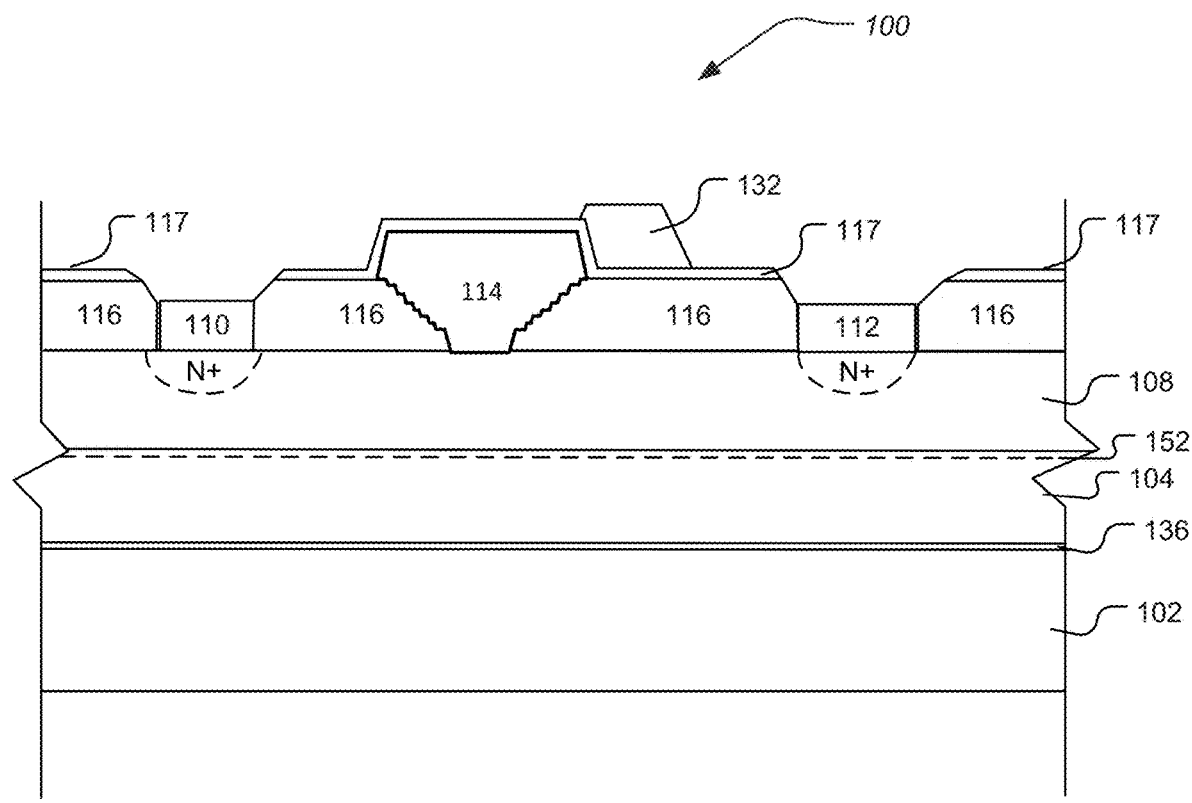
FIG. 12 shows a cross-sectional view of another aspect of a transistor according to the disclosure.

FIG. 12 shows a cross-sectional view of another aspect of a transistor according to the disclosure.

In particular, FIG. 12 is a transistor 100 that may include any one or more of the features of the disclosure. In one aspect, the transistor 100 of FIG. 12 may include one or more of the features of the disclosure illustrated in FIG. 4, FIG. 5, and FIG. 6 and the description thereof. FIG. 12 further illustrates that the transistor 100 may include a spacer layer 117, a field plate 132, and may include a nucleation layer 136. In one aspect, a plurality of the field plates 132 may be used and each of the plurality of field plates 132 may be stacked with a dielectric material therebetween (not shown).

In aspects of the transistor 100 of the disclosure, the substrate layer 102 may be made of Silicon Carbide (SiC) or sapphire. In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be 1E15/cm$^3$ or less. In one aspect, the substrate layer 102 may be formed of SiC selected from the group of 6H, 4H, 15R, 3C SiC, or the like. In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials.

On the substrate layer 102, a buffer layer 104, and/or a nucleation layer 136, may be formed. In one aspect, the buffer layer 104 is formed on the substrate layer 102. In one aspect, the buffer layer 104 is formed directly on the substrate layer 102. In one aspect, the nucleation layer 136 may be formed on the substrate layer 102. In one aspect, the nucleation layer 136 may be formed directly on the substrate layer 102. Intervening layer(s) and/or region(s) are possible throughout the described structures.

In aspects of the transistor 100 of the disclosure, the nucleation layer 136 may be formed on the substrate layer 102 to reduce a lattice mismatch between the substrate layer 102 and a next layer in the transistor 100. The nucleation layer 136 may include many different materials, such as Group III-nitride materials, with a suitable material being Al$_z$Ga$_{1-z}$N (0<=z<=1). The nucleation layer 136 may be formed on the substrate layer 102 using known semiconductor growth techniques such as Metal Oxide Chemical Vapor Deposition (MOCVD), Hydride Vapor Phase Epitaxy (HVPE), Molecular Beam Epitaxy (MBE), or the like. In further aspects, there may be intervening layers between the nucleation layer 136 and the substrate layer 102. In further aspects, there may be intervening layers between the nucleation layer 136 and the buffer layer 104.

The buffer layer 104 may be a group III-nitride, such as GaN, Aluminum Gallium Nitride (AlGaN), Aluminum Nitride (AlN), Al$_x$Ga$_y$In$_{(1-x-y)}$N (where 0<=x<=1, 0<=y<=1, x+y<=1), Al$_x$In$_y$Ga$_{1-x-y}$N (where 0<=x<=1 and 0<=y<=1), and the like, or another suitable material and may also include a nucleation layer 136 of a group III-nitride material, such as AlN. In one aspect, the buffer layer 104 is formed of AlGaN. The buffer layer 104 may be a p-type material, or alternatively can be undoped. In one aspect, an AlN nucleation layer 136 may be used to adhere to the substrate layer 102 and may help grow the buffer layer 104. The buffer layer 104 may bind to the substrate layer 102. In one aspect, the nucleation layer 136 may be AlN or AlGaN.

In one aspect, the buffer layer 104 may be high purity GaN. In one aspect, the buffer layer 104 may be high purity GaN that may be a low-doped n-type. In one aspect, the buffer layer 104 may also use a higher band gap Group III-nitride layer as a back barrier, such as an AlGaN back barrier, on the other side of the buffer layer 104 from the barrier layer 108 to achieve better electron confinement.

In aspects of the transistor 100 of the disclosure, on the buffer layer 104, the barrier layer 108 may be formed. In one aspect, the barrier layer 108 may be formed directly on the buffer layer 104. The barrier layer 108 may provide an additional layer between the buffer layer 104 and the source 110, the drain 112, and the gate 114. The barrier layer 108 may be AlGaN, AlN, a Group III-nitride, InAlGaN, or another suitable material. In one aspect, the barrier layer 108 may be AlGaN. In one aspect, the barrier layer 108 may be undoped. In one aspect, the barrier layer 108 may be doped. In one aspect, the barrier layer 108 may be an n-type material. In some aspects, the barrier layer 108 may have multiple layers of n-type material having different carrier concentrations. In one aspect, the barrier layer 108 may be a Group III-nitride or a combination thereof. In one aspect, a bandgap of the buffer layer 104 may be less than a bandgap of the barrier layer 108. In one aspect, a bandgap of the buffer layer 104 may be less than a bandgap of the barrier layer 108 to form a two-dimensional electron gas (2DEG) at a heterointerface 152 between the buffer layer 104 and barrier layer 108 when biased at an appropriate level. In one aspect, additional Group III-nitride layer(s) or region(s) and/or other layer(s) or region(s) of different materials are possible on the barrier layer 108 and/or in the overall structure. Any of the layers and/or regions can have uniform, non-uniform, graded and/or changing composition, thicknesses, and/or doping.

In aspects of the transistor 100 of the disclosure, the source 110 and/or the drain 112 may be connected directly to the barrier layer 108. In one aspect, the source 110 and/or drain 112 may be connected indirectly to the barrier layer 108. In one aspect, the barrier layer 108 may include a region under the source 110 and/or drain 112 that is an N+ material. In one aspect, the barrier layer 108 may include a region under the source 110 and/or drain 112 that is Si doped.

In aspects of the transistor 100 of the disclosure, the source 110 and/or the drain 112 may be connected directly to the buffer layer 104. In one aspect, the source 110 and/or drain 112 may be connected indirectly to the buffer layer 104. In one aspect, the buffer layer 104 may include a region under the source 110 and/or drain 112 that is an N+ material. In one aspect, the buffer layer 104 may include a region under the source 110 and/or drain 112 that is Si doped.

To protect and separate the gate 114 and the drain 112, the passivation layer 116 may be arranged on the barrier layer 108, on a side opposite the buffer layer 104, adjacent the gate 114 and the drain 112. The passivation layer 116 may be a passivation layer made of SiN, AlO, SiO, $SiO_2$, AlN, or the like, or a combination incorporating multiple layers thereof. In one aspect, the passivation layer 116 is a passivation layer made of SiN. In one aspect, the passivation layer 116 can be deposited using MOCVD, plasma chemical vapor deposition (CVD), hot-filament CVD, or sputtering. In one aspect, the passivation layer 116 may include deposition of $Si_3N_4$. In one aspect, the passivation layer 116 forms an insulating layer. In one aspect, the passivation layer 116 forms an insulator. In one aspect, the passivation layer 116 may be a dielectric.

In aspects of the transistor 100 of the disclosure, a non-conducting spacer layer 117 may be formed over the gate 114 between the source 110 and the drain 112. In one aspect, the spacer layer 117 may include a layer of non-conducting material such as a dielectric. In one aspect, the spacer layer 117 may include a number of different layers of dielectrics or a combination of dielectric layers. In one aspect, the spacer layer 117 may be many different thicknesses, with a suitable range of thicknesses being approximately 0.5 to 2 microns.

In one aspect, the spacer layer 117 may include a material such as a dielectric or insulating material, such as SiN, SiO2, etc. In some aspects the spacer layer 117 may be a passivation layer, such as SiN, AlO, SiO, $SiO_2$, AlN, or the like, or a combination incorporating multiple layers thereof In aspects of the transistor 100 of the disclosure, the buffer layer 104 may be designed to be of the high purity type where the Fermi level is in the upper half of the bandgap, which minimizes slow trapping effects normally observed in GaN HEMTs. In this regard, the traps under the Fermi level are filled always and thus slow transients may be prevented. In some aspects, the buffer layer 104 may be as thin as possible consistent with achieving good crystalline quality. Applicants have already demonstrated 0.4 µm layers with good quality.

In aspects of the transistor 100 of the disclosure, a Group III-nitride nucleation layer 136 and/or buffer layer 104 may be grown on the substrate layer 102 via an epitaxial crystal growth method, such as MOCVD (Metalorganic Chemical Vapor Deposition), HVPE (Hydride Vapor Phase Epitaxy) or MBE (Molecular Beam Epitaxy). The formation of the nucleation layer 136 may depend on the material of the substrate layer 102.

In aspects of the transistor 100 of the disclosure, the buffer layer 104 may be formed with Lateral Epitaxial Overgrowth (LEO). LEO can, for example, improve the crystalline quality of GaN layers. When semiconductor layers of a HEMT are epitaxial, the layer upon which each epitaxial layer is grown may affect the characteristics of the device. For example, LEO may reduce dislocation density in epitaxial GaN layers.

In aspects of the transistor 100 of the disclosure, the buffer layer 104 may include nonpolar GaN. In one aspect, the buffer layer 104 may include semipolar GaN. In one aspect, the buffer layer 104 may include hot wall epitaxy. In one aspect, the buffer layer 104 may include hot wall epitaxy having a thickness in the range of 0.15 microns to 0.25 microns, 0.2 microns to 0.3 microns, 0.25 microns to 0.35 microns, 0.3 microns to 0.35 microns, 0.35 microns to 0.4 microns, 0.4 microns to 0.45 microns, 0.45 microns to 0.5 microns, 0.5 microns to 0.55 microns, or 0.15 microns to 0.55 microns.

In aspects of the transistor 100 of the disclosure, one or more metal overlayers may be provided on one or more of the source 110, the drain 112, and the gate 114. The overlayers may be Au, Silver (Ag), Al, Pt, Ti, Si, Ni, Al, and/or Copper (Cu). Other suitable highly conductive metals may also be used for the overlayers.

In one aspect, the field plate 132 may be arranged on the spacer layer 117 between the gate 114 and drain 112. In one aspect, the field plate 132 may be deposited on the spacer layer 117 between the gate 114 and the drain 112. In some aspects, the field plate 132 may be adjacent the gate 114 and an additional spacer layer 117 of dielectric material may be included at least partially over the gate 114 to isolate the gate 114 from the field plate 132 (not shown). In some aspects, the field plate 132 may overlap the gate 114 and an additional spacer layer 117 of dielectric material may be included at least partially over the gate 114 to isolate the gate 114 from the field plate 132.

The field plate 132 may extend different distances from the edge of the gate 114, with a suitable range of distances being approximately 0.1 to 2 microns. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like.

In one aspect, the field plate 132 may be formed on the spacer layer 117 between the gate 114 and the drain 112, with the field plate 132 being in proximity to the gate 114 but not overlapping the gate 114. In one aspect, a space between the gate 114 and field plate 132 may be wide enough to isolate the gate 114 from the field plate 132, while being small enough to maximize a field effect provided by the field plate 132.

In certain aspects, the field plate 132 may reduce a peak operating electric field in the transistor 100. In certain aspects, the field plate 132 may reduce the peak operating electric field in the transistor 100 and may increase the breakdown voltage of the transistor 100. In certain aspects, the field plate 132 may reduce the peak operating electric field in the transistor 100 and may reduce trapping in the transistor 100. In certain aspects, the field plate 132 may reduce the peak operating electric field in the transistor 100 and may reduce leakage currents in the transistor 100.

In aspects of the transistor 100 of the disclosure, the source 110 and the drain 112 may be symmetrical with respect to the gate 114. In some device application aspects, the source 110 and the drain 112 may be asymmetrical with respect to the gate 114.

FIG. 13 shows a process of making a transistor according to the disclosure.

In particular, FIG. 13 shows an exemplary process 800 for making the transistor 100 of the disclosure. It should be noted that the process 800 is merely exemplary and may be modified consistent with the various aspects disclosed herein.

The process 800 may begin at box 802 by forming a substrate layer 102. The substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be $1E15/cm^3$ or less. The substrate layer 102 may be formed of SiC selected from the group of 6H, 4H, 15R, 3C SiC, or the like. In another aspect, the substrate layer 102 may be GaAs, GaN, or other material suitable for the applications described herein. In another aspect, the substrate layer 102 may include spinel, ZnO, silicon, or any other material capable of supporting growth of Group III-nitride materials. Additionally, the above-noted process may include any other aspects consistent with the disclosure.

The buffer layer 104 may be formed at box 804 on the substrate layer 102. The buffer layer 104 may be grown or deposited on the substrate layer 102. In one aspect, the buffer layer 104 may be GaN. In another aspect, the buffer layer 104 may be formed with LEO. In one aspect, the nucleation layer 136 may be formed on the substrate layer 102 and the buffer layer 104 may be formed on the nucleation layer 136. The buffer layer 104 may be grown or deposited on the nucleation layer 136. In one aspect, the buffer layer 104 may be GaN. In another aspect, the buffer layer 104 may be formed with LEO. Additionally, the above-noted process may include any other aspects consistent with the disclosure.

At box 806, the barrier layer 108 may be formed on the buffer layer 104. The barrier layer 108 may be an n-type conductivity layer or may be undoped. In one aspect, the barrier layer 108 may be AlGaN. In one aspect, the barrier layer 108 may be formed directly on the buffer layer 104. The barrier layer 108 may provide an additional layer between the buffer layer 104 and the source 110, the drain 112, and the gate 114. The barrier layer 108 may be AlGaN, AlN, a Group III-nitride, InAlGaN, or another suitable material. In one aspect, the barrier layer 108 may be AlGaN. In one aspect, the barrier layer 108 may be undoped. In one aspect, the barrier layer 108 may be doped. In one aspect, the barrier layer 108 may be an n-type material. In some aspects, the barrier layer 108 may have multiple layers of n-type material having different carrier concentrations. In one aspect, the barrier layer 108 may be a Group III-nitride or a combination thereof. In one aspect, a bandgap of the buffer layer 104 may be less than a bandgap of the barrier layer 108. In one aspect, a bandgap of the buffer layer 104 may be less than a bandgap of the barrier layer 108 to form a two-dimensional electron gas (2DEG) at a heterointerface 152 between the buffer layer 104 and barrier layer 108 when biased at an appropriate level. In one aspect, additional Group III-nitride layer(s) or region(s) and/or other layer(s) or region(s) of different materials are possible on the barrier layer 108 and/or in the overall structure. Any of the layers and/or regions can have uniform, non-uniform, graded and/or changing composition, thicknesses, and/or doping. Additionally, the above-noted process may include any other aspects consistent with the disclosure.

At box 808, the passivation layer 116 may be formed. The passivation layer 116 may be a passivation layer, such as SiN, AlO, SiO, $SiO_2$, AlN, or the like, or a combination incorporating multiple layers thereof, which may be deposited over the exposed surface of the barrier layer 108. Additionally, the above-noted process may include any other aspects consistent with the disclosure.

In one aspect, for the formation of the gate 114 that may include the step portion 200 and/or the step portions 300 as described herein, the passivation layer 116 may comprise at least one layer and at least one etching process. In one aspect, for the formation of the gate 114 that may include the step portion 200 and/or the step portions 300 as described herein, the passivation layer 116 may comprise a plurality of layers and a plurality of etching processes.

In one aspect, for the formation of the gate 114 that may include the step portion 200 and/or the step portions 300 as described herein, at least one layer of the passivation layer 116 may be deposited; and a shape of the step portion 200 and/or the step portions 300 may be etched in the at least one layer of the passivation layer 116 utilizing at least one photo-lithographic mask.

In one aspect, for the formation of the gate 114 that may include the step portion 200 and/or the step portions 300 as described herein, the passivation layer 116 may include a plurality of layers; each layer may be deposited to form a part of a shape of the step portion 200 and/or the step portions 300; and each layer may be etched utilizing an etching process to form a shape of the step portion 200 and/or the step portions 300 as described herein. The etching process may include any process to remove portions of the passivation layer 116 to form a shape of the step portion 200 and/or the step portions 300 as described herein. The etching processes may include a masking material which resists etching. The masking material may be a photoresist which has been patterned using photolithography. The etching processes may include one or more of wet etching, anisotropic wet etching, plasma etching, and the like.

In one aspect, for the formation of the gate 114 that may include the step portion 200 and/or the step portions 300 as described herein, the passivation layer 116 may include a plurality of layers; each layer may be deposited to form a part of a shape of the step portion 200 and/or the step portions 300; and each layer may be etched utilizing a photo-lithographic mask and/or a plurality of different shaped photo-lithographic masks that may include wider gate length openings to form a shape of the step portion 200 and/or the step portions 300 as described herein.

In one aspect, for the formation of the gate 114 that may include the step portion 200 and/or the step portions 300 as described herein, the passivation layer 116 may include a plurality of layers; each layer may be deposited to form a step of the step portion 200 and/or the step portions 300; and each layer may be etched utilizing a photo-lithographic mask and/or a plurality of different shaped photo-lithographic masks that may include wider gate length openings to each form a step of the step portion 200 and/or the step portions 300 as described herein.

At box 810, the gate 114 may be arranged on the barrier layer 108 between the source 110 and the drain 112. The gate 114 may extend on top of a spacer or the passivation layer 116. The passivation layer 116 may be etched and the gate 114 deposited such that the bottom of the gate 114 is on and/or adjacent the surface of barrier layer 108 as described above. The metal forming the gate 114 may be patterned to extend across passivation layer 116 so that the top of the gate 114 forms a field plate 132.

In particular, the formation of the gate 114 may include the step portion 200 and/or the step portions 300 as described herein. In one aspect, the step portion 200 and/or the step portions 300 of the gate 114 may be formed by etching the passivation layer 116 as described above. Other aspects may be utilized to form the step portion 200 and/or the step portions 300 of the gate 114.

A layer of Ni, Pt, AU, or the like may be formed for the gate 114 by evaporative deposition or another technique. The gate structure may then be completed by deposition of Pt and Au, or other suitable materials. In some aspects, the contacts of the gate 114 may include Al, Ti, Si, Ni, and/or Pt.

Further during the process 800, additional processes 812 may be performed. For example, the source 110 may be arranged on the barrier layer 108. The source 110 may be an ohmic contact of a suitable material that may be annealed. For example, the source 110 may be annealed at a temperature of from about 500° C. to about 800° C. for about 2 minutes. However, other times and temperatures may also be utilized. Times from about 30 seconds to about 10 minutes may be, for example, acceptable. In some aspects, the source 110 may include Al, Ti, Si, Ni, and/or Pt. In one aspect, a region under the source 110 that is an N+ material may be formed in the barrier layer 108. In one aspect, a region under the drain 112 may be Si doped.

Further during the process 812, the drain 112 may be arranged on the barrier layer 108. Like the source 110, the drain 112 may be may be an ohmic contact of Ni or another suitable material, and may also be annealed in a similar fashion. In one aspect, an n+ implant may be used in conjunction with the barrier layer 108 and the contacts are made to the implant. In one aspect, a region under the drain 112 that is an N+ material may be formed in the barrier layer 108. In one aspect, a region under the drain 112 may be Si doped.

The source 110 and the drain 112 electrodes may be formed making ohmic contacts such that an electric current flows between the source 110 and drain 112 electrodes via a two-dimensional electron gas (2DEG) induced at the heterointerface 152 between the buffer layer 104 and barrier layer 108 when a gate 114 electrode is biased at an appropriate level. In one aspect, the heterointerface 152 may be in the range of 0.005 μm to 0.007 μm, 0.007 μm to 0.009 μm, and 0.009 μm to 0.11 μm.

Further during some aspects of the process 812, the field plate 132 may be arranged on top of another protective layer and may be separated from the gate 114. In one aspect, the field plate 132 may be deposited on the spacer layer 117 between the gate 114 and the drain 112. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like. In one aspect, a plurality of the field plates 132 may be used. In one aspect, a plurality of the field plates 132 may be used and each of the plurality of field plates 132 may be stacked with a dielectric material therebetween. In one aspect, the field plate 132 extends toward the edge of gate 114 towards the drain 112. In one aspect, the field plate 132 extends towards the source 110. In one aspect, the field plate 132 extends towards the drain 112 and towards the source 110. In another aspect, the field plate 132 does not extend toward the edge of gate 114. Finally, the structure may be covered with a dielectric spacer layer 117 such as silicon nitride. The dielectric spacer layer 117 may also be implemented similar to the passivation layer 116. Moreover, it should be noted that the cross-sectional shape of the gate 114, shown in the Figures is exemplary. For example, the cross-sectional shape of the gate 114 in some aspects may not include the T-shaped extensions. Other constructions of the gate 114 may be utilized. Additionally, the above-noted process may include any other aspects consistent with the disclosure.

It should be noted that the aspects of process 800 may be performed in a different order consistent with the aspects described above. Additionally, it should be noted that portions of the process 800 may be performed in a different order consistent with the aspects described above. Moreover, the process 800 may be modified to have more or fewer processes consistent with the various aspects disclosed herein.

Accordingly, the disclosure has set forth a transistor 100 and process of making a transistor having a gate that may be configured, structured, and/or arranged to have a gate shape that may modulate an electromagnetic field in a channel layer, resulting in a lower pinch-off voltage and/or a lower leakage current flow. Moreover, the disclosure has set forth a transistor 100 and process of making a transistor having a gate that may be configured, structured, and/or arranged to have a gate shape that may enhance a depletion region in a channel layer, resulting in reducing the leakage current flow. Additionally, the disclosure has set forth a transistor 100 and process of making a transistor having a gate having improved thermal budget that increases tolerable operational temperatures due to a decrease in leakage current. Additionally, the disclosure has set forth a transistor 100 and process of making a transistor having a gate having improved thermal budget that increases device life that may be based in part on direct current (DC) stress, radiofrequency (RF) stress, and the like.

Additionally, as described herein, the gate 114 having the step portion 200 and/or the step portions 300 may be utilized in a Gallium Nitride (GaN) based high-electron mobility transistors (HEMTs). However, the disclosure is not limited to this particular application of the gate 114 having the step portion 200 and/or the step portions 300. The gate 114 having the step portion 200 and/or the step portions 300 may be utilized in other similar micro-electronic devices, other transistors, other semiconductor devices, and the like with similar operational improvements.

In particular aspects, the transistor 100 of the disclosure may be utilized in amplifiers. In further aspects, the transistor 100 of the disclosure may be utilized in wireless base stations that connect to a wireless device. In further aspects, the transistor 100 of the disclosure may be utilized in amplifiers implemented by wireless base stations that connect to a wireless device. In further aspects, the transistor 100 of the disclosure may be utilized in in wireless devices. In further aspects, the transistor 100 of the disclosure may be utilized in amplifiers implemented in wireless devices.

In this disclosure it is to be understood that reference to a wireless device is intended to encompass electronic devices such as mobile phones, tablet computers, gaming systems, MP3 players, personal computers, PDAs, user equipment (UE), and the like. A "wireless device" is intended to encompass any compatible mobile technology computing device that can connect to a wireless communication network, such as mobile phones, mobile equipment, mobile stations, user equipment, cellular phones, smartphones, handsets, wireless dongles, remote alert devices, Internet of things (IoT) based wireless devices, or other mobile computing devices that may be supported by a wireless network. The wireless device may utilize wireless communication technologies like GSM, CDMA, wireless local loop, Wi-Fi, WiMAX, other wide area network (WAN) technology, 3G technology, 4G technology, 5G technology, LTE technology, and the like.

In this disclosure it is to be understood that reference to a wireless base station is intended to cover base transceiver station (BTS), node B devices, Base Station (BS) devices, evolved node B devices, and the like that facilitate wireless communication between wireless devices and a network. The wireless base station and/or the network may utilize wireless communication technologies like GSM, CDMA, wireless local loop, Wi-Fi, WiMAX, other wide area network (WAN) technology, 3G technology, 4G technology, 5G technology, LTE technology, and the like.

In aspects, the dimensions of d1, d2, d3, and/or d4 may be critical in order to modulate an electromagnetic field in a channel layer, resulting in a lower pinch-off voltage, a lower leakage current flow, and/or the like. In aspects, the dimensions of d1, d2, d3, and/or d4 may be critical in order to enhance a depletion region in a channel layer, resulting in reducing the leakage current flow.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A device comprising:
   a substrate;
   a buffer layer on the substrate;
   a barrier layer on the buffer layer;
   a passivation layer on the barrier layer and the passivation layer comprising a recess;
   a source electrically coupled to the barrier layer;
   a gate on the barrier layer and the gate is structured and arranged to further extend across the passivation layer;
   a drain electrically coupled to the barrier layer; and
   the gate comprising at least one first surface connected to at least one second surface through at least one inflection point on either side of the recess,
   wherein the at least one inflection point, the at least one first surface, and the at least one second surface are arranged within the passivation layer;
   wherein the gate fills the recess of the passivation layer;
   wherein the at least one first surface comprises at least four of the at least one first surface; and
   wherein the at least one second surface comprises at least four of the at least one second surface.

2. The device according to claim 1 further comprising at least one step portion that includes the at least one inflection point,
   wherein the gate further comprises a portion arranged vertically above the at least one step portion and vertically above the passivation layer;
   wherein the at least one step portion includes the at least one first surface and the at least one second surface; and
   wherein the at least one first surface is connected to the at least one second surface by the at least one inflection point.

3. The device according to claim 1 further comprising a spacer layer arranged over the gate, wherein:
   the at least one first surface is inclined with respect to a line perpendicular to an upper surface of the passivation layer; and
   at least one of the at least one first surface extends to a bottom surface of the gate.

4. The device according to claim 2 wherein:
   the gate further comprises a surface arranged along an upper surface of the passivation layer and the surface is connected to the portion;
   the gate comprises a third surface; and
   the at least one step portion is connected to the third surface.

5. The device according to claim 4 further comprising a spacer layer arranged over the gate,
   wherein the third surface extends to a bottom surface of the gate.

6. The device according to claim 4 further comprising a spacer layer arranged over the gate,
   wherein the third surface is inclined with respect to a line perpendicular to an upper surface of the passivation layer.

7. A device comprising:
   a substrate;
   a buffer layer on the substrate;
   a barrier layer on the buffer layer;
   a passivation layer on the barrier layer and the passivation layer comprising a recess;
   a source electrically coupled to the barrier layer;
   a gate on the barrier layer;
   a drain electrically coupled to the barrier layer;
   the gate comprising at least one first surface connected to at least one second surface through at least one inflection point on either side of the recess;
   at least one step portion that includes the at least one inflection point; and
   at least one field plate,
   wherein the at least one inflection point, the at least one first surface, and the at least one second surface are arranged within the passivation layer;
   wherein the gate fills the recess of the passivation layer;
   wherein the at least one first surface comprises at least four of the at least one first surface; and
   wherein the at least one second surface comprises at least four of the at least one second surface;
   wherein the gate further comprises a portion arranged vertically above the at least one step portion;
   wherein the at least one step portion includes the at least one first surface and the at least one second surface;
   wherein the at least one first surface is connected to the at least one second surface by the at least one inflection point; and
   wherein a depth of the at least one first surface along a line perpendicular to an upper surface of the passivation layer being 10%-80% of a depth of the passivation layer.

8. The device according to claim 2 further comprising a spacer layer arranged over the gate,
   wherein a depth of the at least one second surface along a line parallel to an upper surface of the passivation layer is 5%-80% of a distance from a lower left edge of the gate to a lower right edge of the source.

9. The device according to claim 1 wherein:
the gate further comprises a surface arranged along an upper surface of the passivation layer and the surface is connected to a portion arranged vertically above the passivation layer; and
the gate is configured to modulate an electromagnetic field in a channel layer to lower a pinch-off voltage and reduce a leakage current flow.

10. The device according to claim 1 wherein:
the gate further comprises a surface arranged along an upper surface of the passivation layer and the surface is connected to a portion arranged vertically above the passivation layer; and
the gate is configured to enhance a depletion region in a channel layer to reduce a leakage current flow and maintain designed parasitic capacitances for designed device performance.

11. An amplifier comprising the device according to claim 1.

12. A process of forming a device comprising:
providing a substrate;
arranging a buffer layer on the substrate;
arranging a barrier layer on the buffer layer;
electrically coupling a source to the barrier layer;
electrically coupling a drain to the barrier layer;
forming a passivation layer on the barrier layer and the passivation layer comprising a recess; and
forming a gate on the barrier layer and the gate extends across the passivation layer, the gate comprising at least one first surface connected to at least one second surface through at least one inflection point on either side of the recess,
wherein the at least one inflection point, the at least one first surface, and the at least one second surface are arranged within the passivation layer; and
wherein the gate fills the recess of the passivation layer;
wherein the at least one first surface comprises at least four of the at least one first surface; and
wherein the at least one second surface comprises at least four of the at least one second surface.

13. The process of forming the device according to claim 12 further comprising:
forming at least one step portion to include the at least one first surface, the at least one second surface, and the at least one inflection point; and
forming the at least one first surface to connect to the at least one second surface by the at least one inflection point,
wherein the gate further comprises a portion arranged vertically above the at least one step portion and vertically above the passivation layer.

14. The process of forming the device according to claim 13 further comprising:
forming the at least one first surface to be inclined with respect to a line perpendicular to an upper surface of the passivation layer, wherein at least one of the at least one first surface extends to a bottom surface of the gate; and
arranging a spacer layer over the gate.

15. The process of forming the device according to claim 13 further comprising:
forming the gate to include a third surface; and
forming the at least one step portion to connect to the third surface,
wherein the gate further comprises a surface arranged along an upper surface of the passivation layer and the surface is connected to the portion.

16. The process of forming the device according to claim 15 further comprising:
forming the third surface to extend to a bottom surface of the gate; and
arranging a spacer layer over the gate.

17. The process of forming the device according to claim 15 further comprising:
forming the third surface to be inclined with respect to a line perpendicular to an upper surface of the passivation layer; and
arranging a spacer layer over the gate.

18. The process of forming the device according to claim 14 wherein:
the at least one step portion comprises at least four of the at least one step portion.

19. The process of forming the device according to claim 13 further comprising:
forming at least one field plate; and
forming the at least one step portion to have a depth of the at least one first surface along a line perpendicular to an upper surface of the passivation layer can be 10%-80% of a depth of the passivation layer.

20. The process of forming the device according to claim 13 further comprising forming the at least one step portion to have a depth of the at least one second surface along a line parallel to an upper surface of the passivation layer to be 5%-80% of a distance from a lower left edge of the gate to a lower right edge of the source.

21. The process of forming the device according to claim 12 further comprising forming the gate to modulate an electromagnetic field in a channel layer to lower a pinch-off voltage and reduce a leakage current flow and maintain designed parasitic capacitances for designed device performance,
wherein the gate further comprises a surface arranged along an upper surface of the passivation layer and the surface is connected to a portion arranged vertically above the passivation layer.

22. The process of forming the device according to claim 12 further comprising forming the gate to enhance a depletion region in a channel layer to reduce a leakage current flow and maintain designed parasitic capacitances for designed device performance,
wherein the gate further comprises a surface arranged along an upper surface of the passivation layer and the surface is connected to a portion arranged vertically above the passivation layer.

23. The process of forming the device according to claim 13 wherein the forming the at least one step portion comprises:
forming at least one layer of the passivation layer;
etching the at least one layer of the passivation layer to form an etched surface consistent with at least a portion of the at least one step portion in the at least one layer of the passivation layer; and
forming the gate in the etched surface so as to form the gate with the at least one step portion in the at least one layer of the passivation layer.

24. The device according to claim 1 further comprising a spacer layer arranged over the gate,
wherein the gate further comprises a portion arranged vertically above the at least one inflection point, the at least one first surface, the at least one second surface and the passivation layer; and wherein the gate further comprises a surface arranged along an upper surface of the passivation layer and the surface is connected to the portion.

25. The process of forming the device according to claim 13 further comprising arranging a spacer layer over the gate, wherein the gate further comprises a portion arranged vertically above the at least one inflection point, the at least one first surface, the at least one second surface and the passivation layer; and wherein the gate further comprises a surface arranged along an upper surface of the passivation layer and the surface is connected to the portion.

\* \* \* \* \*